United States Patent
Sasaki et al.

(10) Patent No.: US 9,960,279 B2
(45) Date of Patent: May 1, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Toshinari Sasaki, Tochigi (JP); Kosei Noda, Atsugi (JP); Yuhei Sato, Atsugi (JP); Yuta Endo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 540 days.

(21) Appl. No.: 14/560,259

(22) Filed: Dec. 4, 2014

(65) Prior Publication Data

US 2015/0084050 A1 Mar. 26, 2015

Related U.S. Application Data

(63) Continuation of application No. 13/651,809, filed on Oct. 15, 2012, now Pat. No. 8,927,990.

(30) Foreign Application Priority Data

Oct. 21, 2011 (JP) .................................. 2011-231477

(51) Int. Cl.
| | |
|---|---|
| *H01L 29/78* | (2006.01) |
| *H01L 29/786* | (2006.01) |
| *H01L 29/423* | (2006.01) |

(52) U.S. Cl.
CPC .... *H01L 29/7869* (2013.01); *H01L 29/42364* (2013.01)

(58) Field of Classification Search
CPC ..................................................... H01L 29/786
(Continued)

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | | |
|---|---|---|---|
| EP | 1095908 A | 5/2001 | |
| EP | 1737044 A | 12/2006 | |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — Julio J Maldonado
*Assistant Examiner* — Joseph Galvin, III
(74) *Attorney, Agent, or Firm* — Robinson Intellectual Property Law Office; Eric J. Robinson

(57) ABSTRACT

Hydrogen concentration and oxygen vacancies in an oxide semiconductor film are reduced. Reliability of a semiconductor device which includes a transistor using an oxide semiconductor film is improved. One embodiment of the present invention is a semiconductor device which includes a base insulating film; an oxide semiconductor film formed over the base insulating film; a gate insulating film formed over the oxide semiconductor film; and a gate electrode overlapping with the oxide semiconductor film with the gate insulating film provided therebetween. The base insulating film shows a signal at a g value of 2.01 by electron spin resonance. The oxide semiconductor film does not show a signal at a g value of 1.93 by electron spin resonance.

18 Claims, 22 Drawing Sheets

(58) Field of Classification Search
USPC .............................................. 257/43, 52, 57
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,326,248 | B1* | 12/2001 | Ohtani et al. ............... 438/151 |
| 6,563,174 | B2 | 5/2003 | Kawasaki et al. |
| 6,727,522 | B1 | 4/2004 | Kawasaki et al. |
| 6,830,741 | B1 | 12/2004 | Sakatani et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,237,166 | B2 | 8/2012 | Kumomi et al. |
| 8,334,532 | B2 | 12/2012 | Umeda et al. |
| 8,461,594 | B2 | 6/2013 | Morosawa et al. |
| 8,487,308 | B2 | 7/2013 | Ikeda et al. |
| 8,502,217 | B2 | 8/2013 | Sato et al. |
| 8,581,170 | B2 | 11/2013 | Kurokawa |
| 8,742,418 | B2 | 6/2014 | Morosawa et al. |
| 9,196,738 | B2 | 11/2015 | Sakata et al. |
| 2001/0046027 | A1 | 11/2001 | Tai et al. |
| 2002/0055208 | A1 | 5/2002 | Ohtani et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0142543 | A1* | 7/2004 | Fukunaga ............... C23C 10/02 438/486 |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0026583 | A1 | 2/2007 | Ikeda et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0315026 | A1 | 12/2009 | Jeong et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0068336 | A1 | 3/2011 | Yamazaki et al. |
| 2011/0090204 | A1 | 4/2011 | Yamazaki et al. |
| 2011/0101335 | A1 | 5/2011 | Yamazaki et al. |
| 2011/0147738 | A1 | 6/2011 | Yamazaki et al. |
| 2011/0215331 | A1 | 9/2011 | Yamazaki et al. |
| 2011/0284844 | A1* | 11/2011 | Endo ............... H01L 29/78603 257/57 |
| 2011/0284846 | A1 | 11/2011 | Endo et al. |
| 2012/0018727 | A1 | 1/2012 | Endo et al. |
| 2014/0061739 | A1 | 3/2014 | Kurokawa |
| 2016/0043230 | A1 | 2/2016 | Sakata et al. |

FOREIGN PATENT DOCUMENTS

| | | |
|---|---|---|
| EP | 1942079 A | 7/2008 |
| EP | 2136406 A | 12/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-275600 A | 9/2003 |
| JP | 2003-300729 A | 10/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2006-165528 A | 6/2006 |
| JP | 2010-060683 A | 3/2010 |
| JP | 2010-114413 A | 5/2010 |
| JP | 2010-263182 A | 11/2010 |
| JP | 2011-001249 A | 1/2011 |
| JP | 2011-141523 A | 7/2011 |
| JP | 2011-142311 A | 7/2011 |
| JP | 2011-159697 A | 8/2011 |
| JP | 2011-205081 A | 10/2011 |
| JP | 2011-211171 A | 10/2011 |
| WO | WO-2004/114391 | 12/2004 |
| WO | WO-2009/072532 | 6/2009 |
| WO | WO-2011/046032 | 4/2011 |
| WO | WO-2011/071185 | 6/2011 |
| WO | WO-2011/099343 | 8/2011 |
| WO | WO-2011/108381 | 9/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT', SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and Sc2O3—A2O3—BO Systems [A; Fe; Ga; or Al; B; Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 101137461) dated Mar. 9, 2016.

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit (IC) and an image display device (display device). A silicon-based semiconductor is widely known as a semiconductor applicable to the transistor. In recent years, an oxide semiconductor has attracted attention.

For example, a transistor in which an amorphous oxide film containing indium, gallium, and zinc and having an electron carrier concentration of lower than $10^{18}/cm^3$ is used for a channel region of the transistor is disclosed (see Patent Document 1).

A transistor including an oxide semiconductor film is known to have a problem of low reliability because of possibility of change in electrical characteristics, although the transistor including an oxide semiconductor film can operate at higher speed than a transistor including amorphous silicon and can be manufactured more easily than a transistor including polycrystalline silicon. Specific examples of the problem include change in threshold voltage of the transistor after a bias-temperature test (BT test).

REFERENCE

Patent Document

[Patent Document 1] Japanese Published Patent Application No. 2006-165528

SUMMARY OF THE INVENTION

Change in electrical characteristics (e.g., threshold voltage) which results from operation of a transistor causes a reduction in reliability of a semiconductor device which includes the transistor.

In a transistor using an oxide semiconductor film, change in electrical characteristics is attributable to trapping of carriers in impurity levels due to hydrogen and/or defect levels due to oxygen vacancies in the oxide semiconductor film.

By performing heat treatment on the oxide semiconductor film at 450° C. or higher, hydrogen concentration can be significantly reduced; however, oxygen vacancies in the oxide semiconductor film are increased at the same time.

Thus, an object of one embodiment of the present invention is to reduce hydrogen concentration and oxygen vacancies in the oxide semiconductor film.

Another object of one embodiment of the present invention is to improve reliability of a semiconductor device which includes a transistor using an oxide semiconductor film.

The oxygen vacancies in an oxide semiconductor film can be measured by electron spin resonance (ESR). Specifically, when the oxide semiconductor film includes oxygen vacancies, the oxide semiconductor film shows a signal at a g value of 1.93 by ESR.

Therefore, when an oxide semiconductor film has low hydrogen concentration and does not show a signal at a g value of 1.93 by ESR, impurity levels due to hydrogen and defect levels due to oxygen vacancies hardly exist in the oxide semiconductor film. Accordingly, in the transistor using the oxide semiconductor film, change in electrical characteristics which results from operation of the transistor is small.

Similarly, in the case where a base insulating film is a film from which oxygen is released by heat treatment, the base insulating film shows a signal at a g value of 2.01 by ESR.

For example, it is possible to reduce oxygen vacancies in the oxide semiconductor film by oxygen that is released from the base insulating film by heat treatment. To cause this phenomenon, a film showing a signal at a g value of 2.01 by ESR is preferably used as the base insulating film.

Note that when the oxide semiconductor film is provided between the base insulating film and a gate insulating film and heat treatment is performed, oxygen released from the base insulating film can be efficiently supplied to the oxide semiconductor film. Further, when the heat treatment is performed at a temperature higher than or equal to 450° C. and lower than or equal to 700° C., hydrogen concentration in the oxide semiconductor film can be reduced.

However, depending on the kind or a formation method of the base insulating film, the heat treatment changes the base insulating film into the one not showing a signal at a g value of 2.01 by ESR. In order to reduce change in the electrical characteristics of the transistor, the base insulating film preferably shows a signal at a g value of 2.01 by ESR even after the heat treatment.

Further, in the case where an oxide semiconductor film is processed in a manufacturing process of the transistor, outward diffusion of oxygen which is released from the base insulating film occurs in a region where the oxide semiconductor film is not formed. As a result, the heat treatment changes the base insulating film into the one not showing a signal at a g value of 2.01 by ESR.

Here, in a semiconductor device where a plurality of transistors include the base insulating film which shows a signal at a g value of 2.01 by ESR and the oxide semiconductor film which does not show a signal at a g value of 1.93 by ESR and has low hydrogen concentration, the oxide semiconductor film has an extremely low carrier density and hardly has conductivity. Accordingly, in the semiconductor device, unintended current flow does not occur between the transistors even in the case where the oxide semiconductor film is not processed into an island shape.

Conventionally, when a semiconductor device includes a plurality of transistors, an oxide semiconductor film has been commonly processed into an island shape so that the transistors are electrically isolated. On the other hand, in a semiconductor device according to one embodiment of the present invention, processing of the oxide semiconductor film into an island shape for electric isolation between the transistors is not performed. Thus, as compared to the case of a conventional semiconductor device, outward diffusion of oxygen that is released from the base insulating film does not easily occur. In other words, the base insulating film readily shows a signal at a g value of 2.01 by ESR even after heat treatment is performed. Therefore, in a transistor according to one embodiment of the present invention, change in electrical characteristics which results from operation of the transistor can be reduced.

One embodiment of the present invention is a semiconductor device which includes a base insulating film; an oxide semiconductor film formed over the base insulating film; a gate insulating film formed over the oxide semiconductor film; and a gate electrode overlapping with the oxide semiconductor film with the gate insulating film provided therebetween. The base insulating film shows a signal at a g value of 2.01 by ESR. The oxide semiconductor film does not show a signal at a g value of 1.93 by ESR.

Further, a base insulating film including a first region and a second region is formed, an oxide semiconductor film is formed over the base insulating film, a gate insulating film is formed over the oxide semiconductor film, and then heat treatment is performed, whereby a third region and a fourth region having different conductivities can be formed in the oxide semiconductor film.

Note that the third region of the oxide semiconductor film is formed in a region overlapping with the first region of the base insulating film, and the fourth region of the oxide semiconductor film is formed in a region overlapping with the second region of the base insulating film.

For example, in a semiconductor device which includes a plurality of transistors using an oxide semiconductor film, when the third regions of the oxide semiconductor film are regions which do not show a signal at a g value of 1.93 by ESR and have low hydrogen concentration, the third regions have extremely high resistance, so that unintended current flow does not occur between the transistors even in the case where the oxide semiconductor film is not processed into island shapes.

In view of the above, a semiconductor device according to one embodiment of the present invention includes a base insulating film having a first region and a second region; an oxide semiconductor film formed over the base insulating film and having a third region and a fourth region; a gate insulating film formed over the oxide semiconductor film; and a gate electrode overlapping with the fourth region of the oxide semiconductor film with the gate insulating film provided therebetween. The third region of the oxide semiconductor film is a region overlapping with the first region of the base insulating film. The fourth region of the oxide semiconductor film is a region overlapping with the second region of the base insulating film. The second region of the base insulating film shows a signal at a g value of 2.01 by ESR. The third region of the oxide semiconductor film does not show a signal at a g value of 1.93 by ESR.

Further, when the first region of the base insulating film is a region which contains silicon and does not show a signal at a g value of 2.01 by ESR, the transistor formed in the first region can have an increased on-state current. An on-state current of a transistor refers to a current which flows between a source region and a drain region when the transistor is in an on state (also referred to as drain current). An on state of a transistor refers to a state where a potential higher than or equal to the threshold voltage of the transistor is applied to a gate electrode. Note that in this specification, threshold voltage refers to a gate voltage which is needed to turn on a transistor. A gate voltage refers to a potential difference between a source potential and a gate potential when the source potential is regarded as a reference potential.

By heat treatment at a high temperature, hydrogen concentration in the oxide semiconductor film can be reduced. Moreover, by supply of oxygen from the base insulating film, oxygen vacancies in the oxide semiconductor film can be reduced.

When impurity levels due to hydrogen and defect levels due to oxygen vacancies are reduced, a semiconductor device which includes a transistor using the oxide semiconductor film can have improved reliability.

DETAILED DESCRIPTION OF THE INVENTION

Figure 1A:
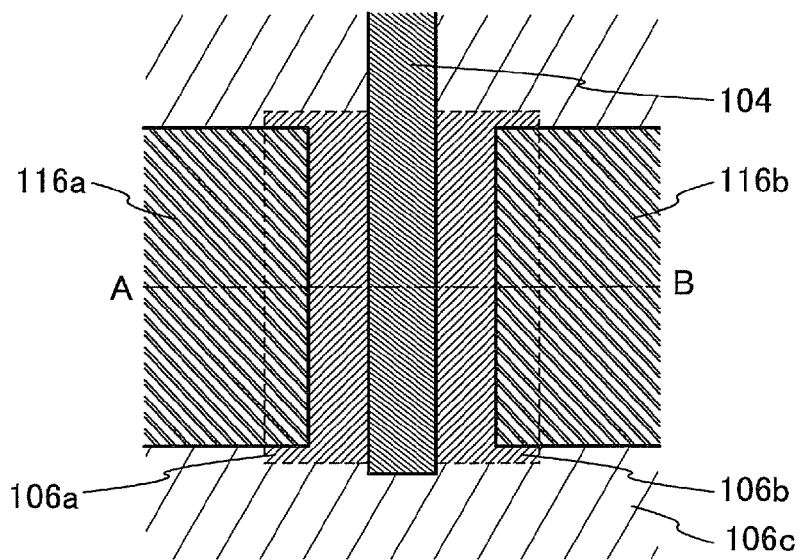
FIGS. 1A to 1C are a top view and cross-sectional views which illustrate an example of a transistor according to one embodiment of the present invention.

Embodiments of the present invention will be described below with reference to the drawings. However, the present invention is not limited to the description below, and it is easily understood by those skilled in the art that modes and details disclosed herein can be modified in various ways. The present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that ordinal numbers such as "first" and "second" are used for convenience and do not denote the order of steps or the stacking order of layers. In addition, the ordinal numbers in this specification do not denote particular names which specify the present invention.

Embodiment 1

In this embodiment, a transistor according to one embodiment of the present invention and a method for manufacturing the transistor will be described with reference to FIGS. 1A to 1C, FIGS. 2A to 2C, and FIGS. 3A to 3C.

Figure 1B:
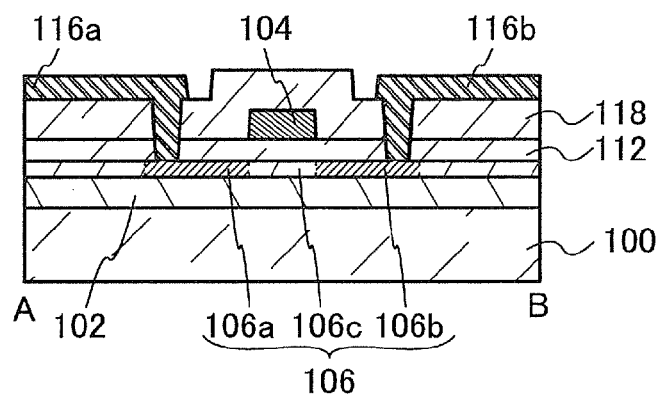

FIG. 1A is a top view of a transistor according to one embodiment of the present invention. FIG. 1B is a cross-sectional view along dashed-dotted line A-B in FIG. 1A. Note that for simplicity, an interlayer insulating film 118, a gate insulating film 112, and the like are not shown in FIG. 1A.

The transistor illustrated in FIG. 1B includes a base insulating film 102 formed over a substrate 100; an oxide semiconductor film 106 formed over the base insulating film 102 and including a first region 106a, a second region 106b, and a third region 106c; the gate insulating film 112 formed over the oxide semiconductor film 106; and a gate electrode 104 overlapping with part of the third region 106c of the oxide semiconductor film 106 with the gate insulating film 112 provided therebetween.

Note that in FIG. 1A, one side edge of the first region 106a and one side edge of the second region 106b of the oxide semiconductor film 106 overlap with side edge portions of the gate the electrode 104 which are parallel to the longitudinal direction. In other words, in FIG. 1B, one edge of the first region 106a and one edge of the second region 106b of the oxide semiconductor film 106 overlap with lower edge portions of the gate electrode 104.

Note that the first region 106a and the second region 106b of the oxide semiconductor film 106 function as a source region and a drain region of the transistor. A region of the third region 106c of the oxide semiconductor film 106 which is located below the gate electrode 104 and between the first region 106a and the second region 106b functions as a channel region of the transistor.

A region other than the channel region in the third region 106c of the oxide semiconductor film 106 functions as an insulating region. Thus, even in the case where the oxide semiconductor film 106 is used for channel regions of a plurality of transistors, the transistors can be electrically isolated from each other.

Note that the transistor illustrated in FIG. 1B may include the interlayer insulating film 118 formed over the gate electrode 104 and the gate insulating film 112; and a wiring 116a and a wiring 116b which are respectively in contact with the first region 106a and the second region 106b of the oxide semiconductor film 106 through opening portions which are provided in the interlayer insulating film 118 and the gate insulating film 112 to reach the first region 106a and the second region 106b of the oxide semiconductor film 106.

Further, the gate electrode 104 may be connected to a wiring formed in the same layer as the wiring 116a and the wiring 116b.

The base insulating film 102 is an insulating film which shows a signal at a g value of 2.01 by ESR.

Note that evaluation of electron spin by ESR can be performed with an electron spin resonance spectrometer JES-FA300 manufactured by JEOL Ltd., an spectrometer E500 CW-EPR manufactured by Bruker BioSpin K.K., or the like.

Note that in this specification, showing a signal at a g value of 2.01 by ESR refers to showing an asymmetrical signal whose center is positioned at a g value of approximately 2.01 (greater than or equal to 2.005 and less than or equal to 2.015) by ESR. The signal indicates the existence of a dangling bond of an oxygen atom included in the insulating film. Showing a signal at a g value of 2.01 by ESR indicates that the spin density of spins which indicate dangling bonds of oxygen atoms is $5 \times 10^{17}$ spins/cm$^3$ or more. Not showing a signal at a g value of 2.01 by ESR indicates that the spin density of spins which indicate dangling bonds of oxygen atoms is less than $5 \times 10^{17}$ spins/cm$^3$.

For the base insulating film 102, specifically, an oxide film which has a single-layer structure or a stacked-layer structure and contains one or more of magnesium, aluminum, vanadium, chromium, germanium, yttrium, lanthanum, hafnium, zirconium, and tantalum may be used.

For the base insulating film 102, an insulating film from which oxygen is released by heat treatment at a temperature higher than or equal to 450° C. and lower than or equal to 700° C. is preferably used.

Note that the expression "oxygen is released by heat treatment" means that the amount of released oxygen when converted into oxygen atoms in TDS analysis is $1.0 \times 10^{18}$ atoms/cm$^3$ or more, preferably $3.0 \times 10^{18}$ atoms/cm$^3$ or more, further preferably $1.0 \times 10^{19}$ atoms/cm$^3$ or more, still further preferably $3.0 \times 10^{19}$ atoms/cm$^3$ or more.

Here, a method for measuring the amount of released oxygen using TDS will be described.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{o2}$) from a measurement sample can be calculated according to Formula (1) using the TDS results of a silicon wafer containing hydrogen at a predetermined density, which is the reference sample, and the TDS results of the measurement sample. Here, all gasses having a mass-to-charge ratio (m/z) of 32 which are obtained by the TDS are assumed to originate from an oxygen molecule. CH₃OH, which is given as a gas at m/z=32, is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

[Formula 1]

$$N_{O2} = \frac{N_{H2}}{S_{H2}} \times S_{O2} \times \alpha \qquad (1)$$

$N_{H2}$ is the value obtained by conversion of the number of hydrogen molecules desorbed from the reference sample into density. $S_{H2}$ is the integral value of ion intensity when the reference sample is analyzed by TDS. Here, the reference value of the reference sample is expressed by $N_{H2}/S_{H2}$. $S_{O2}$ is the integral value of ion intensity when the measurement sample is analyzed by TDS. $\alpha$ is a coefficient affecting the ion intensity in the TDS. For details of Formula (1), Japanese Published Patent Application No. H6-275697 is referred to. Note that the amount of released oxygen was measured with a thermal desorption spectroscopy apparatus manufactured by ESCO Ltd., EMD-WA1000S/W using a silicon wafer containing hydrogen atoms at $1 \times 10^{16}$ atoms/cm³ as the reference sample.

Further, in the TDS, part of oxygen is detected as an oxygen atom. The ratio between oxygen molecules and oxygen atoms can be calculated from the ionization rate of oxygen molecules. Note that since the above α includes the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

It is preferable that the base insulating film 102 be sufficiently flat. Specifically, the film serving as a base is provided so as to have an average surface roughness (Ra) of 1 nm or less, preferably 0.3 nm or less, further preferably 0.1 nm or less. When Ra is less than or equal to the above value, a crystal region is easily formed in the oxide semiconductor film 106. Note that Ra is obtained by expanding, into three dimensions, arithmetic mean surface roughness that is defined by JIS B 0601: 2001 (ISO4287:1997) so as to be able to apply it to a curved surface. Ra can be expressed as "an average value of the absolute values of deviations from a reference surface to a designated surface" and is defined by Formula (2).

[Formula 2]

$$Ra = \frac{1}{S_0} \int_{y1}^{y2} \int_{x1}^{x2} |f(x, y) - Z_0| dx dy \qquad (2)$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the designated surface on the xy plane, and $Z_0$ represents the height of the reference surface (the average height of the designated surface). Ra can be measured using an atomic force microscope (AFM).

It is preferable that the oxide semiconductor film 106 do not show a signal at a g value of 1.93 by ESR. At least the third region 106c of the oxide semiconductor film 106 does not show a signal at a g value of 1.93 by ESR.

Note that in this specification, showing a signal at a g value of 1.93 by ESR refers to showing a symmetrical signal whose center is positioned at a g value of approximately 1.93 (greater than or equal to 1.88 and less than or equal to 1.98, more specifically greater than or equal to 1.91 and less than or equal to 1.95) by ESR. The signal indicates the existence of a dangling bond of a metal atom included in the oxide semiconductor film. Showing a signal at a g value of 1.93 by ESR indicates that the spin density of spins which indicate dangling bonds of metal atoms is $5 \times 10^{16}$ spins/cm³ or more. Not showing a signal at a g value of 1.93 by ESR indicates that the spin density of spins which indicate dangling bonds of metal atoms is less than $5 \times 10^{16}$ spins/cm³.

The first region 106a and the second region 106b of the oxide semiconductor film 106 include impurities which reduce the resistance of the oxide semiconductor film. Specifically, the first region 106a and the second region 106b of the oxide semiconductor film 106 are regions including at least one kind of impurities selected from helium, boron, nitrogen, fluorine, neon, aluminum, phosphorus, argon, arsenic, krypton, indium, tin, antimony, and xenon.

As the oxide semiconductor film 106, an In—M—Zn oxide film may be used. Here, M is an element whose bond energy with oxygen is higher than that of In and that of Zn. Alternatively, M is an element which has a function of suppressing desorption of oxygen from the In—M—Zn oxide film. Owing to the effect of M, generation of oxygen vacancies in the oxide semiconductor film is suppressed. Therefore, change in electrical characteristics of the transistor, which is caused by oxygen vacancies, can be reduced; accordingly, a highly reliable transistor can be obtained.

M may be, specifically, Al, Si, Sc, Ti, V, Cr, Mn, Fe, Co, Ni, Ga, Ge, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf.

Note that the oxide semiconductor film 106 is an oxide semiconductor film which has a wide band gap and low hydrogen concentration, and does not show a signal at a g value of 1.93 by ESR. Accordingly, a transistor using the oxide semiconductor film 106 can have an extremely low off-state current. Specifically, the off-state current can be $1 \times 10^{-21}$ A or lower, preferably $1 \times 10^{-24}$ A or lower.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface on which the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°.

In the CAAC-OS film, distribution of crystal parts is not necessarily uniform. For example, in the formation process of the CAAC-OS film, in the case where crystal growth occurs from a surface side of the oxide semiconductor film 106, the proportion of crystal parts in the vicinity of the surface of the oxide semiconductor film is higher than that in the vicinity of the surface on which the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface on which the CAAC-OS film is formed or a normal vector of a surface of the CAAC-OS film, the directions of the c-axes may be different from each other depending on the shape of the CAAC-OS film (the cross-sectional shape of the surface on which the CAAC-OS film is formed or the cross-sectional shape of the surface of the CAAC-OS film). Note that when the CAAC-OS film is formed, the direction of c-axis of the crystal part is the direction parallel to a normal vector of the surface on which the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Further alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Any of these substrates further provided with a semiconductor element may be used as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The gate insulating film 112 may be formed to have a single-layer structure or a stacked-layer structure including at least one of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

The gate electrode 104 can be formed to have a single-layer structure or a stacked-layer structure including at least one of Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn oxynitride or the like may be used.

As the interlayer insulating film 118, a film selected from the insulating films given as examples of the gate insulating film 112 may be used.

It is preferable that the interlayer insulating film 118 have low relative permittivity and a sufficient thickness. For example, a silicon oxide film having a relative permittivity of approximately 3.8 and a thickness of greater than or equal to 300 nm and less than or equal to 1000 nm may be provided. A surface of the interlayer insulating film 118 has a little fixed charge because of the influence of atmospheric components and the like, which might cause the shift of the threshold voltage of the transistor. Therefore, it is preferable that the interlayer insulating film 118 have relative permittivity and a thickness such that the influence of the charge at the surface is sufficiently reduced. For the same reason, a resin film may be formed over the interlayer insulating film 118 to reduce the influence of the charge at the surface.

For the wiring 116a and the wiring 116b, a film selected from the conductive films given as examples of the gate electrode 104 may be used. Note that the wiring 116a and the wiring 116b may be formed in the same layer.

Figure 1C:
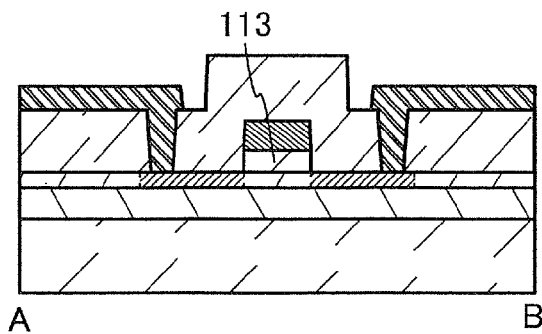

Note that the transistor illustrated in FIG. 1C is similar to the transistor illustrated in FIG. 1B except for the shape of the gate insulating film. Specifically, while the gate insulating film 112 is provided to cover the oxide semiconductor film 106 in the transistor illustrated in FIG. 1B, the top shape of a gate insulating film 113 is similar to that of the gate electrode 104 in the transistor illustrated in FIG. 1C.

A method for manufacturing the transistor illustrated in FIG. 1B will be described below.

Figure 2A:
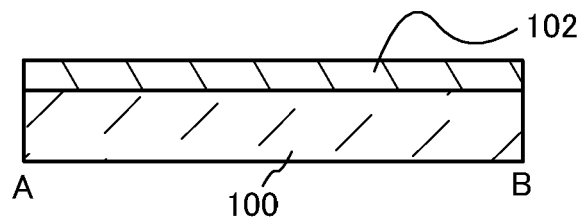
FIGS. 2A to 2C are cross-sectional views illustrating an example of a manufacturing method of a transistor according to one embodiment of the present invention.

First, the substrate 100 is prepared and the base insulating film 102 is formed over the substrate 100 (see FIG. 2A). The base insulating film 102 can be formed by a sputtering method, a chemical vapor deposition (CVD) method, a molecular beam epitaxy (MBE) method, an atomic layer deposition (ALD) method, or a pulsed laser deposition (PLD) method.

For the base insulating film 102, a sputtering method is preferably used. At this time, a deposition gas is used which includes an oxidizing gas (oxygen, ozone, or nitrous oxide) at 5% or more, preferably 10% or more, further preferably 20% or more, still further preferably 50% or more. As the deposition gas, a gas in which the concentration of impurities such as hydrogen is low is used. Further, a substrate heating temperature at the time of deposition is higher than or equal to room temperature and lower than or equal to 200° C., preferably higher than or equal to room temperature and lower than or equal to 150° C., further preferably higher than or equal to room temperature and lower than or equal to 120° C. When the base insulating film 102 is formed in the above-described manner, the base insulating film 102 has low concentration of impurities such as hydrogen and can easily contain excess oxygen, so that a dangling bond of an oxygen atom is readily formed in the base insulating film 102. That is, an insulating film showing a signal at a g value of 2.01 by ESR can be formed. Note that room temperature is typically 20° C. or 25° C.

Figure 2B:
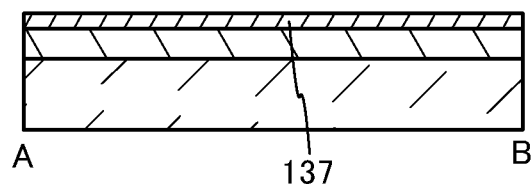

Then, an oxide semiconductor film 137 is formed over the base insulating film 102 (see FIG. 2B). The oxide semiconductor film 137 may be formed by a sputtering method, a CVD method, an MBE method, an ALD method, or a PLD method.

For the oxide semiconductor film 137, a sputtering method is preferably used. At this time, a deposition gas is used which includes an oxidizing gas at 5% or more, preferably 10% or more, further preferably 20% or more, still further preferably 50% or more. As the deposition gas, a gas in which the concentration of impurities such as hydrogen is low is used. Further, a substrate heating temperature at the time of deposition is higher than or equal to room temperature and lower than or equal to 450° C., preferably higher than or equal to 100° C. and lower than or equal to 400° C., further preferably higher than or equal to 150° C. and lower than or equal to 350° C. When the oxide semiconductor film 137 is formed in the above-described manner, the concentration of impurities such as hydrogen is low and oxygen vacancies are not easily generated in the oxide semiconductor film 137, so that a dangling bond of a metal atom is not readily formed. That is, an oxide semiconductor film not showing a signal at a g value of 1.93 by ESR can be formed.

Figure 2C:
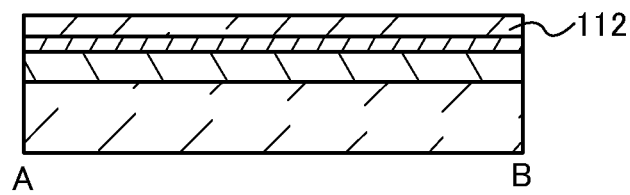

Then, the gate insulating film 112 is formed over the oxide semiconductor film 137 (see FIG. 2C). The gate insulating film 112 may be formed by a sputtering method, a CVD method, an MBE method, an ALD method, or a PLD method.

The gate insulating film 112 may be formed by a method similar to that of the base insulating film 102. In this case, the gate insulating film 112 can be an insulating film which shows a signal at a g value of 2.01 by ESR.

After the formation of the gate insulating film 112, first heat treatment is performed, so that the oxide semiconductor film 137 becomes an oxide semiconductor film 136 which has lower hydrogen concentration. The first heat treatment is performed in an inert gas (nitrogen, or a rare gas such as helium, neon, argon, krypton, or xenon) atmosphere, an atmosphere containing an oxidizing gas at 10 ppm or more, preferably 1% or more, further preferably 10% or more, or a reduced pressure state (10 Pa or lower), at a temperature higher than or equal to 450° C. and lower than or equal to 700° C., preferably higher than or equal to 500° C. and lower than or equal to 700° C., further preferably higher than or equal to 550° C. and lower than or equal to 700° C.

By the first heat treatment, hydrogen concentration in the oxide semiconductor film 137 is reduced. When heat treatment is performed at a temperature higher than or equal to 450° C. and lower than or equal to 700° C., oxygen vacancies in an oxide semiconductor film are normally increased; however, in this embodiment, oxygen is released from the base insulating film 102 or the like and supplied to the oxide semiconductor film 137 by the first heat treatment, whereby an increase in oxygen vacancies in the oxide semiconductor film 137 due to the first heat treatment can be suppressed. Moreover, in some cases, the oxide semiconductor film 136 includes less oxygen vacancies than the oxide semiconductor film 137 just after being formed.

That is, by the first heat treatment, the oxide semiconductor film 136 can be an oxide semiconductor film which does not show a signal at a g value of 1.93 by ESR and has low hydrogen concentration. This means that the oxide semiconductor film 136 is an oxide semiconductor film which has extremely low hydrogen concentration, a small number of oxygen vacancies, and high resistance.

Note that it is preferable that even after the first heat treatment, the base insulating film 102 contain oxygen which can be released by heat treatment. Specifically, it is preferable that the base insulating film 102 show a signal at a g value of 2.01 by ESR even after the first heat treatment.

Further, the first heat treatment is performed in a state where the oxide semiconductor film 137 is provided between the base insulating film 102 and the gate insulating film 112, whereby outward diffusion of oxygen that is released from the base insulating film 102 does not easily occur. In other words, the base insulating film 102 readily shows a signal at a g value of 2.01 by ESR even after the first heat treatment is performed.

Then, a conductive film to be the gate electrode 104 is formed over the oxide semiconductor film 136 with the gate insulating film 112 provided therebetween. The conductive film may be formed by a sputtering method, a CVD method, an MBE method, an ALD method, or a PLD method.

Figure 3A:
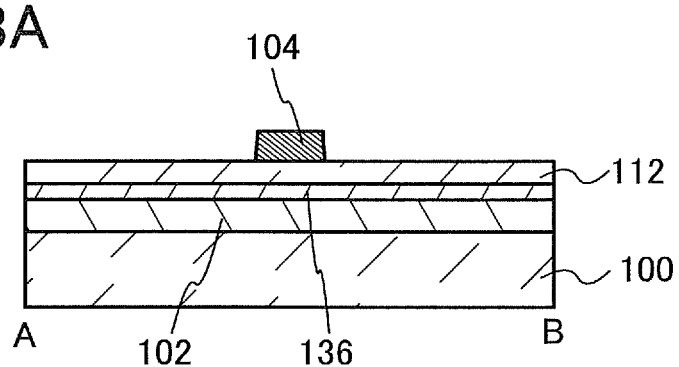
FIGS. 3A to 3C are cross-sectional views illustrating an example of a manufacturing method of a transistor according to one embodiment of the present invention.
Figure 3B:
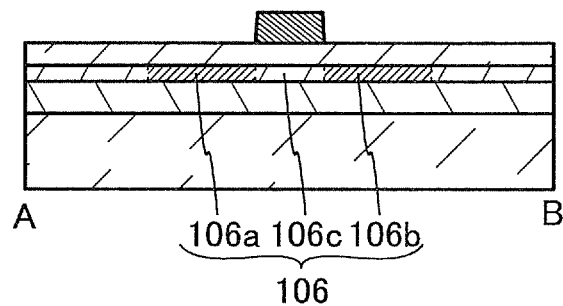

After that, the gate electrode 104 is formed by processing the conductive film to be the gate electrode 104 (see FIG. 3A). Note that the simple term "processing" means in this specification that a film is formed into a desired shape, for example, using a resist mask formed by a photolithography process.

Then, impurities are added to the oxide semiconductor film 136 using the resist mask formed by a photolithography process and the gate electrode 104 as masks, so that the first region 106a, the second region 106b, and the third region 106c are formed. The impurities here are impurities which reduce the resistance of the oxide semiconductor film. Specifically, one or more of helium, boron, nitrogen, fluorine, neon, aluminum, phosphorus, argon, arsenic, krypton, indium, tin, antimony, and xenon may be added. The method for adding the impurities may be an ion implantation method or an ion doping method. Alternatively, plasma treatment or heat treatment in an atmosphere including the impurities that reduce the resistance of the oxide semiconductor film may be employed. Preferably, an ion implantation method is used.

Note that after adding the impurities that reduce the resistance of the oxide semiconductor film by an ion implantation method, second heat treatment may be performed. The second heat treatment may be performed in a manner similar to that of the first heat treatment. Note that the second heat treatment may be performed instead of the first heat treatment. Note that the third region 106c is a region to which the impurities are not added. It is also possible that the oxide semiconductor film 136 becomes the oxide semiconductor film 106 which includes the first region 106a, the second region 106b, and the third region 106c by performing the second heat treatment after the addition of the impurities (see FIG. 3B).

It is preferable that even after the second heat treatment, the base insulating film 102 contain oxygen which can be released by heat treatment. Specifically, it is preferable that the base insulating film 102 show a signal at a g value of 2.01 by ESR even after the second heat treatment.

The second heat treatment is performed in a state where the oxide semiconductor film 136 is provided between the base insulating film 102 and the gate insulating film 112, whereby outward diffusion of oxygen released from the base insulating film 102 does not easily occur. In other words, the base insulating film 102 readily shows a signal at a g value of 2.01 by ESR even after the second heat treatment is performed.

Then, the interlayer insulating film 118 is formed over the gate insulating film 112 and the gate electrode 104. The interlayer insulating film 118 may be formed by a sputtering method, a CVD method, an MBE method, an ALD method, or a PLD method.

The interlayer insulating film 118 may be formed by a method similar to that of the base insulating film 102. In this case, the interlayer insulating film 118 can be an insulating film which shows a signal at a g value of 2.01 by ESR.

Then, the interlayer insulating film 118 and the gate insulating film 112 are processed, so that the opening portions exposing the first region 106a and the second region 106b of the oxide semiconductor film 106 are formed. The formation of the opening portions is performed in conditions which prevent etching of the oxide semiconductor film 106 as much as possible. However, the present invention is not limited thereto. Specifically, at the time of being formed, the opening portions may penetrate the oxide semiconductor film 106 to expose the base insulating film 102.

Then, over the interlayer insulating film 118 and the exposed first and second regions 106a and 106b of the oxide semiconductor film 106, a conductive film to be the wiring 116a and the wiring 116b is formed. The conductive film may be formed by a sputtering method, a CVD method, an MBE method, an ALD method, or a PLD method.

Figure 3C:
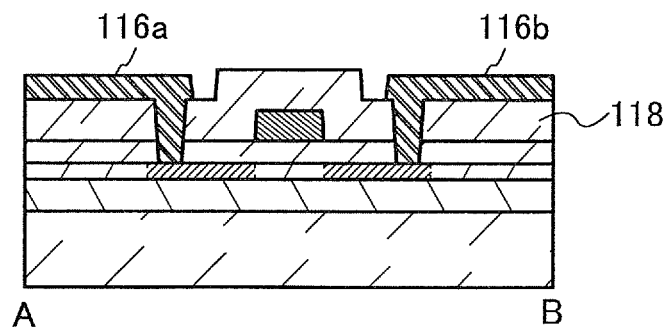

After that, the conductive film to be the wiring 116a and the wiring 116b is processed, so that the wiring 116a and the wiring 116b are formed (see FIG. 3C).

Through the above-described process, the transistor illustrated in FIG. 1B can be manufactured.

Note that the transistor illustrated in FIG. 1C is different from the transistor illustrated in FIG. 1B only in the shape of the gate insulating film. Thus, for the details of the manufacturing method of the transistor illustrated in FIG. 1C, the manufacturing method of the transistor illustrated in FIG. 1B may be referred to.

The transistor obtained in this embodiment uses the oxide semiconductor film having a small number of oxygen vacancies and low hydrogen concentration, and the base insulating film from which oxygen is released by heat treatment. Thus, change in electrical characteristics which results from operation of the transistor is small. In addition, a semiconductor device which uses the transistor is highly reliable.

This embodiment can be combined with the other embodiments as appropriate.

Embodiment 2

In this embodiment, transistors having structures different from those of the transistors in Embodiment 1 and a method for manufacturing the transistors will be described with reference to FIGS. 4A to 4C, FIGS. 5A to 5C, FIGS. 6A to 6C, FIGS. 7A to 7C, and FIGS. 8A to 8C.

Figure 4A:
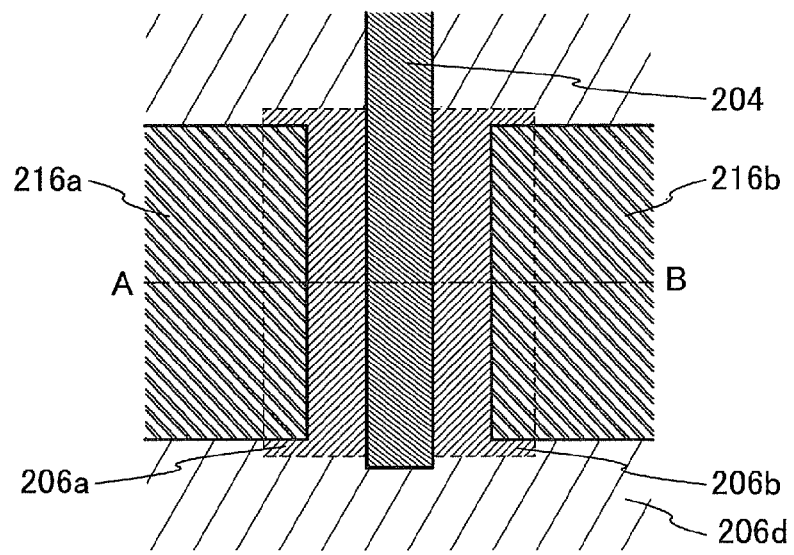
FIGS. 4A to 4C are a top view and cross-sectional views illustrating an example of a transistor according to one embodiment of the present invention.
Figure 4B:
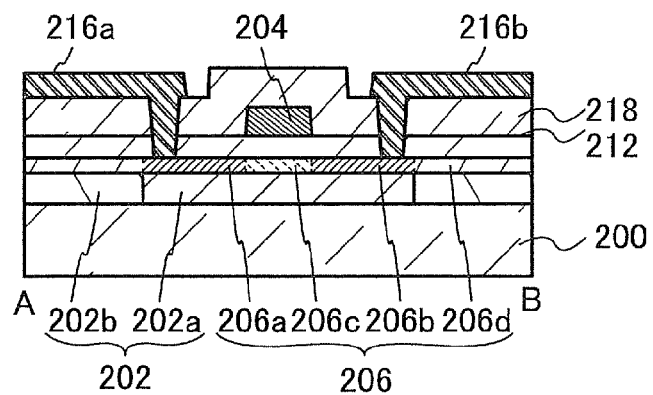

FIG. 4A is a top view of a transistor according to one embodiment of the present invention. FIG. 4B is a cross-sectional view along dashed-dotted line A-B in FIG. 4A. Note that for simplicity, an interlayer insulating film 218, a gate insulating film 212, and the like are not shown in FIG. 4A.

The transistor illustrated in FIG. 4B includes a base insulating film 202 formed over a substrate 200 and including a first region 202a and a second region 202b; an oxide semiconductor film 206 formed over the base insulating film 202 and including a third region 206a, a fourth region 206b, a fifth region 206c, and a sixth region 206d; the gate insulating film 212 formed over the oxide semiconductor film 206; and a gate electrode 204 overlapping with the fifth region 206c of the oxide semiconductor film 206 with the gate insulating film 212 provided therebetween.

Note that in FIG. 4A, one side edge of the third region 206a and one side edge of the fourth region 206b of the oxide semiconductor film 206 overlap with side edge portions of the gate the electrode 204 which are parallel to the longitudinal direction. In other words, in FIG. 4B, one edge of the third region 206a and one edge of the fourth region 206b of the oxide semiconductor film 206 overlap with lower edge portions of the gate electrode 204.

Here, the sixth region 206d of the oxide semiconductor film 206 may be a region overlapping with the second region 202b of the base insulating film 202. The region consisting of the third region 206a, the fourth region 206b, and the fifth region 206c of the oxide semiconductor film 206 may be a region overlapping with the first region 202a of the base insulating film 202. This structure is preferable because a common photomask can be used for the base insulating film 202 and the oxide semiconductor film 206 at the time of formation of the transistor. The fifth region 206c of the oxide semiconductor film 206 is a region which is located between the third region 206a and the fourth region 206b of the oxide semiconductor film 206, and has two edges overlapping with the side edge portions of the gate electrode 204 which are parallel to the longitudinal direction in FIG. 4A. In other words, in FIG. 4B, the two edges of fifth region 206c of the oxide semiconductor film 206 overlap with the lower edge portions of the gate electrode 204.

Note that the third region 206a and the fourth region 206b of the oxide semiconductor film 206 function as a source region and a drain region of the transistor. The fifth region 206c of the oxide semiconductor film 206 functions as a channel region of the transistor.

The sixth region 206d of the oxide semiconductor film 206 functions as an insulating region. Thus, even in the case where a plurality of transistors are provided in one layer, the transistors can be electrically isolated from each other.

Note that the transistor illustrated in FIG. 4B may include the interlayer insulating film 218 formed over the gate electrode 204 and the gate insulating film 212; and a wiring 216a and a wiring 216b which are respectively in contact with the third region 206a and the fourth region 206b of the oxide semiconductor film 206 through opening portions which are provided in the interlayer insulating film 218 and the gate insulating film 212 to reach the third region 206a and the fourth region 206b of the oxide semiconductor film 206.

Further, the gate electrode 204 may be connected to a wiring formed in the same layer as the wiring 216a and the wiring 216b.

Here, for the second region 202b of the base insulating film 202, an insulating film which is similar to that for the base insulating film 102 may be used.

The first region 202a of the base insulating film 202 is an insulating film which does not show a signal at a g value of 2.01 by ESR.

The first region 202a of the base insulating film 202 includes silicon. Specifically, the first region 202a of the base insulating film 202 may have a single-layer structure or a stacked-layer structure and contain a silicon oxide film and/or a silicon oxynitride film.

For the first region 202a of the base insulating film 202, an insulating film from which oxygen is released by heat treatment at a temperature higher than or equal to 200° C. and lower than 450° C. is preferably used.

For the oxide semiconductor film 206, an oxide film which is similar to that for the oxide semiconductor film 106 may be used.

The third region 206a and the fourth region 206b of the oxide semiconductor film 206 may be regions similar to the first region 106a and the second region 106b of the oxide semiconductor film 106.

As the substrate 200, a substrate similar to the substrate 100 may be used.

For the gate insulating film 212, an insulating film similar to that for the gate insulating film 112 may be used.

For the gate electrode 204, a conductive film similar to that for the gate electrode 104 may be used.

For the interlayer insulating film 218, an insulating film similar to that for the interlayer insulating film 118 may be used.

For the wiring 216a and the wiring 216b, a conductive film similar to that for the wiring 116a and the wiring 116b may be used.

Figure 4C:
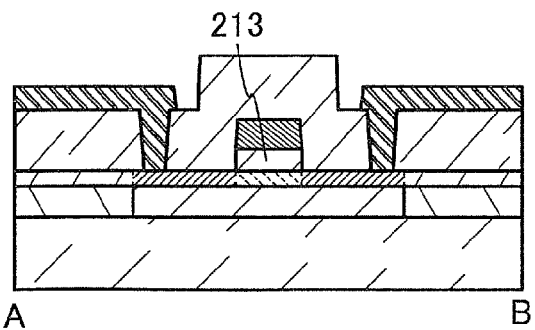

Note that the transistor illustrated in FIG. 4C is similar to the transistor illustrated in FIG. 4B except for the shape of the gate insulating film. Specifically, while the gate insulating film 212 is provided to cover the oxide semiconductor film 206 in the transistor illustrated in FIG. 4B, the top shape of a gate insulating film 213 is similar to that of the gate electrode 204 in the transistor illustrated in FIG. 4C.

In the transistor described in this embodiment, the first region 202a of the base insulating film 202 is a region not showing a signal at a g value of 2.01 by ESR. Therefore, the resistances of the third region 206a and the fourth region 206b of the oxide semiconductor film 206, which are located over the first region 202a of the base insulating film 202, can be easily reduced and are unlikely to be increased, whereby an on-state current of the transistor can be increased.

A method for manufacturing the transistor illustrated in FIG. 4B will be described below.

A method for forming the base insulating film 202 including the first region 202a and the second region 202b is described with reference to FIGS. 5A to 5C.

First, the substrate 200 is prepared and an insulating film to be the first region 202a is formed over the substrate 200. The insulating film to be the first region 202a can be formed by a sputtering method, a CVD method, an MBE method, an ALD method, or a PLD method.

Figure 5A:
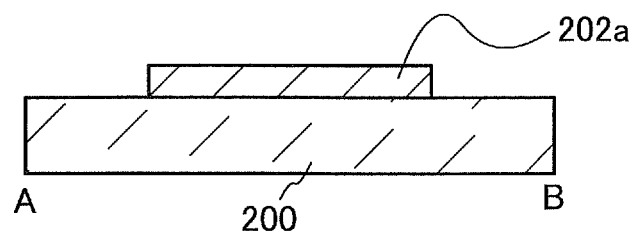
FIGS. 5A to 5C are cross-sectional views illustrating an example of a manufacturing method of a transistor according to one embodiment of the present invention.

Then, the insulating film to be the first region 202a is processed, so that the first region 202a is formed (see FIG. 5A).

Figure 5B:
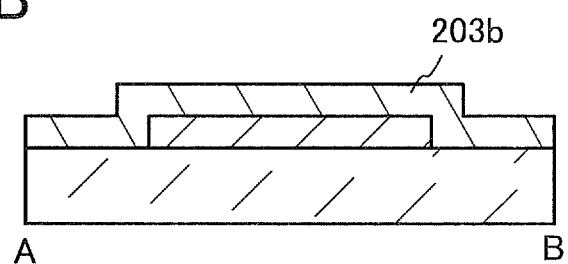

After that, an insulating film 203b is formed to cover the first region 202a and the substrate 200 (see FIG. 5B). The insulating film 203b may be formed by a sputtering method, a CVD method, an MBE method, an ALD method, or a PLD method.

In the case where an edge portion of the first region 202a has a taper angle at this time, the insulating film 203b can favorably cover the first region 202a, whereby a space is not easily formed in a step portion or the like.

The expression "have a taper angle" means that the taper angle θ is greater than or equal to 20° and less than 90° (preferably greater than or equal to 40° and less than) 85°.

Figure 5C:
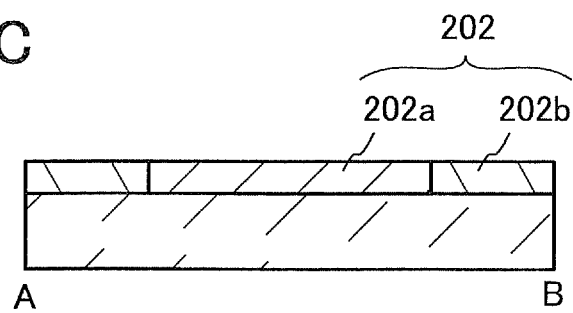

Then, treatment for exposing the first region 202a is performed, so that the base insulating film 202 including the first region 202a and the second region 202b is formed (see FIG. 5C). Note that by performing the treatment for exposing the first region 202a, the surfaces of the first region 202a and the second region 202b have substantially the same height.

The treatment for exposing the first region 202a refers to treatment in which removal of the insulating film 203b proceeds from the top surface such that the insulating film 203b is made flat, and the first region 202a is exposed. Specifically, chemical mechanical polishing (CMP) treatment, etching treatment, or the like may be performed until the first region 202a is exposed.

When etching treatment is employed to expose the first region 202a, the etching treatment may be performed after a planarization film is formed over the insulating film 203b, under conditions in which the etching rate of the planarization film is substantially the same as that of the second insulating film 203b.

A method for forming the base insulating film 202 including the first region 202a and the second region 202b, which is different from the method described with reference to FIGS. 5A to 5C, will be described with reference to FIGS. 6A to 6C.

First, the substrate 200 is prepared and an insulating film to be the second region 202b is formed over the substrate 200. The insulating film to be the second region 202b can be formed by a sputtering method, a CVD method, an MBE method, an ALD method, or a PLD method.

Figure 6A:
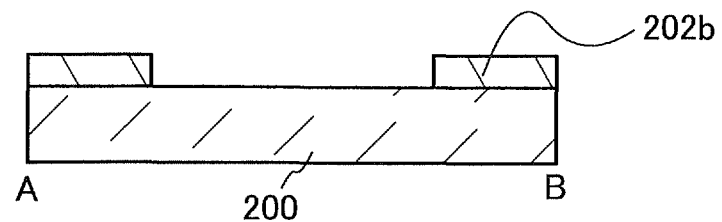
FIGS. 6A to 6C are cross-sectional views illustrating an example of a manufacturing method of a transistor according to one embodiment of the present invention.

Then, the insulating film to be the second region 202b is processed, so that the second region 202b is formed (see FIG. 6A).

Figure 6B:
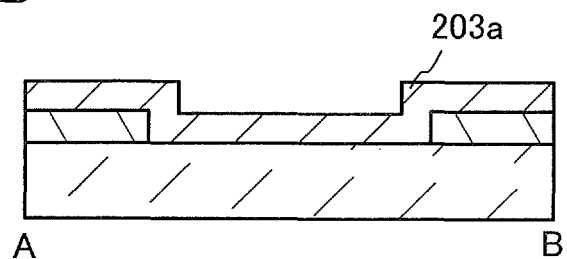

After that, an insulating film 203a is formed to cover the second region 202b and the substrate 200 (see FIG. 6B). The insulating film 203a may be formed by a sputtering method, a CVD method, an MBE method, an ALD method, or a PLD method.

In the case where an edge portion of the second region 202b has a taper angle at this time, the insulating film 203a can favorably cover the second region 202b, whereby a space is not easily formed in a step portion or the like.

Figure 6C:
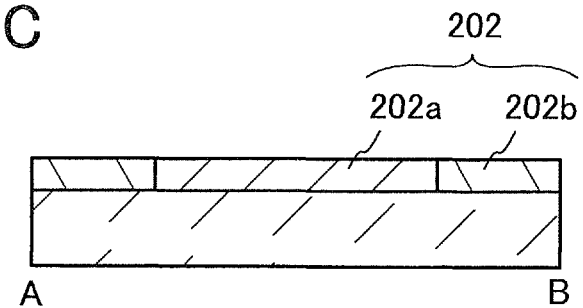

Then, treatment for exposing the second region 202b is performed, so that the base insulating film 202 including the first region 202a and the second region 202b is formed (see FIG. 6C). Note that by performing the treatment for exposing the second region 202b, the surfaces of the first region 202a and the second region 202b have substantially the same height.

The treatment for exposing the second region 202b may be performed by a method similar to that for the treatment for exposing the first region 202a which is described with reference to FIGS. 5A to 5C. Specifically, CMP treatment, etching treatment, or the like may be employed.

In the above manner, the base insulating film 202 including the first region 202a and the second region 202b can be formed.

Figure 7A:
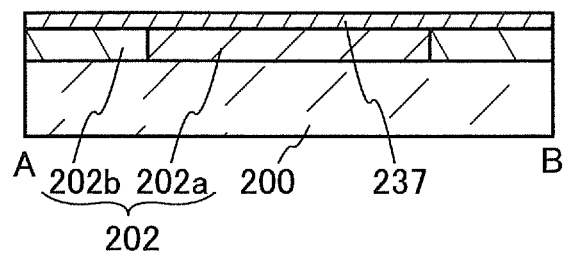
FIGS. 7A to 7C are cross-sectional views illustrating an example of a manufacturing method of a transistor according to one embodiment of the present invention.

Then, an oxide semiconductor film 237 is formed over the base insulating film 202 (see FIG. 7A). The oxide semiconductor film 237 may be formed by a method similar to that for the oxide semiconductor film 137.

Figure 7B:
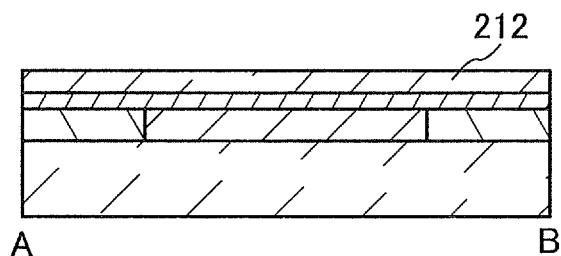

Then, the gate insulating film 212 is formed over the oxide semiconductor film 237 (see FIG. 7B).

Figure 7C:
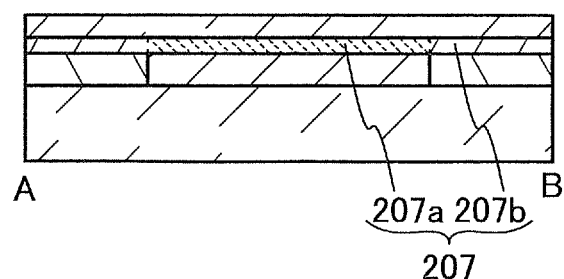

Then, first heat treatment is performed, so that an oxide semiconductor film 207 including a third region 207a and a fourth region 207b is formed (see FIG. 7C).

The first heat treatment may be performed in a manner similar to that of the first heat treatment described in Embodiment 1.

Here, the third region 207a of the oxide semiconductor film 207 is a region overlapping with the first region 202a of the base insulating film 202. The fourth region 207b of the oxide semiconductor film 207 is a region overlapping with the second region 202b of the base insulating film 202. This structure is formed because the first region 202a and the second region 202b of the base insulating film 202 differ in the amount of oxygen which is supplied from the base insulating film 202 to the oxide semiconductor film 237 by the first heat treatment.

Note that by the first heat treatment, the first region 202a of the base insulating film 202 releases almost all the oxygen which can be supplied to the oxide semiconductor film 206. Thus, the first region 202a of the base insulating film 202 does not show a signal at a g value of 2.01 by ESR after the first heat treatment. In contrast, the second region 202b of the base insulating film 202 shows a signal at a g value of 2.01 by ESR even after the first heat treatment.

The first heat treatment is performed in a state where the oxide semiconductor film 237 is provided between the base insulating film 202 and the gate insulating film 212, whereby outward diffusion of oxygen released from the base insulating film 202 does not easily occur. In other words, although the first region 202a of the base insulating film 202 does not show a signal at a g value of 2.01 by ESR after the first heat treatment, in the oxide semiconductor film 206 which is formed over the first region 202a, oxygen vacancies are not easily generated by later treatment at a temperature lower than or equal to that of the first heat treatment.

Figure 8A:
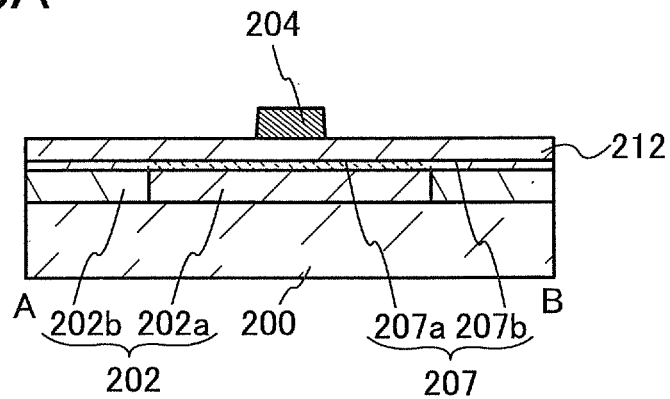
FIGS. 8A to 8C are cross-sectional views illustrating an example of a manufacturing method of a transistor according to one embodiment of the present invention.
Figure 8B:
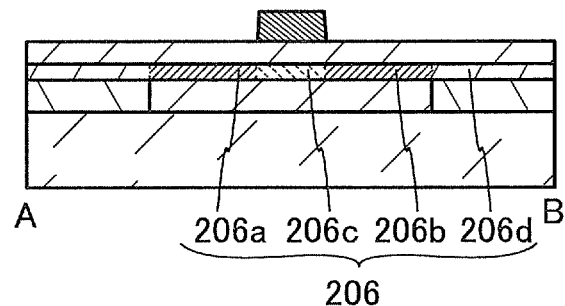

Then, the gate electrode 204 is formed over the gate insulating film 212 (see FIG. 8A). Note that the first heat treatment may be performed after the formation of the gate electrode 204, instead of after the formation of the gate insulating film 212.

Then, impurities are added to the oxide semiconductor film 207 using a resist mask formed by a photolithography process and the gate electrode 204 as masks, so that the third region 206a, the fourth region 206b, the fifth region 206c, and the sixth region 206d are formed. The addition of the impurities here may be performed by the method described in Embodiment 1.

Note that after adding the impurities, second heat treatment may be performed. The second heat treatment may be performed in a manner similar to that of the first heat treatment. The second heat treatment may be performed instead of the first heat treatment. Note that the fifth region 206c and the sixth region 206d are regions to which the impurities are not added. It is also possible that the oxide semiconductor film 207 becomes the oxide semiconductor film 206 which includes the third region 206a, the fourth region 206b, the fifth region 206c, and the sixth region 206d by performing the second heat treatment after the addition of the impurities (see FIG. 8B).

Note that the first region 202a of the base insulating film 202 is a region not showing a signal at a g value of 2.01 by ESR. Therefore, the resistances of the third region 206a and the fourth region 206b of the oxide semiconductor film 206, which are located over the first region 202a of the base insulating film 202, can be easily reduced by the addition of the impurities and are unlikely to be increased by the second heat treatment, whereby an on-state current of the transistor can be increased.

Note that the photomask used for the formation of the first region 202a and the second region 202b of the base insulating film 202 may be used as the photomask in the photolithography process for the addition of the impurities.

Then, the interlayer insulating film 218 is formed over the gate insulating film 212 and the gate electrode 204.

Then, the interlayer insulating film 218 and the gate insulating film 212 are processed, so that the opening portions exposing the third region 206a and the fourth region 206b of the oxide semiconductor film 206 are formed. The formation of the opening portions is performed in conditions which prevent etching of the oxide semiconductor film 206 as much as possible. However, the present invention is not limited thereto. Specifically, at the time of being formed, the opening portions may penetrate the oxide semiconductor film 206 to expose the base insulating film 202.

Figure 8C:
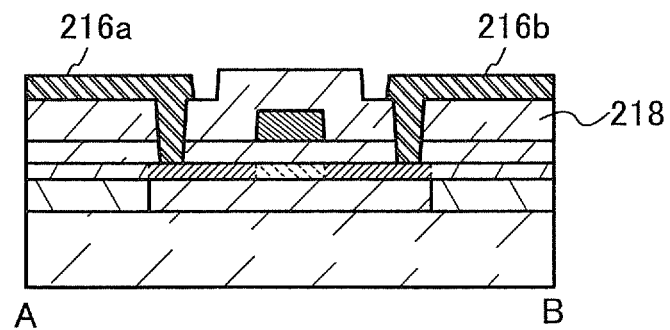

Then, over the interlayer insulating film 218 and the exposed third and fourth regions 206a and 206b of the oxide semiconductor film 206, the wiring 216a and the wiring 216b are formed (see FIG. 8C).

Through the above-described process, the transistor illustrated in FIG. 4B can be manufactured.

Note that the transistor illustrated in FIG. 4C is different from the transistor illustrated in FIG. 4B only in the shape of the gate insulating film. Thus, for the details of the manufacturing method of the transistor illustrated in FIG. 4C, the manufacturing method of the transistor illustrated in FIG. 4B may be referred to.

The transistor obtained in this embodiment uses the oxide semiconductor film having a small number of oxygen vacancies and low hydrogen concentration, and the base insulating film from which oxygen is released by heat treatment. Thus, change in electrical characteristics which results from operation of the transistor is small. In addition, a semiconductor device which uses the transistor is highly reliable.

Moreover, the regions whose resistance can be easily reduced and is unlikely to be increased are used as the source and drain regions of the transistor; therefore, the transistor can have a high on-state current.

This embodiment can be combined with the other embodiments as appropriate.

Embodiment 3

In this embodiment, transistors having structures different from those of the transistors in Embodiments 1 and 2 and a method for manufacturing the transistors will be described with reference to FIGS. 9A and 9B and FIGS. 10A to 10C.

Figure 9A:
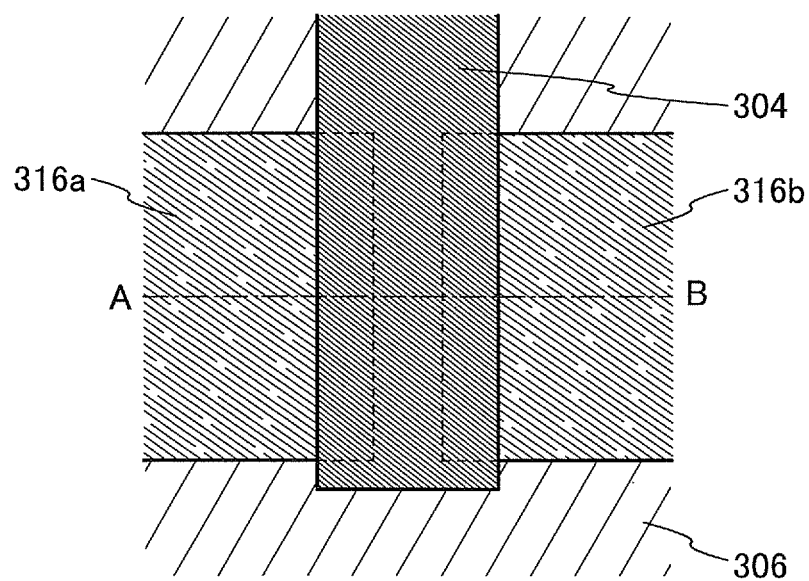
FIGS. 9A and 9B are a top view and a cross-sectional view illustrating an example of a transistor according to one embodiment of the present invention.
Figure 9B:
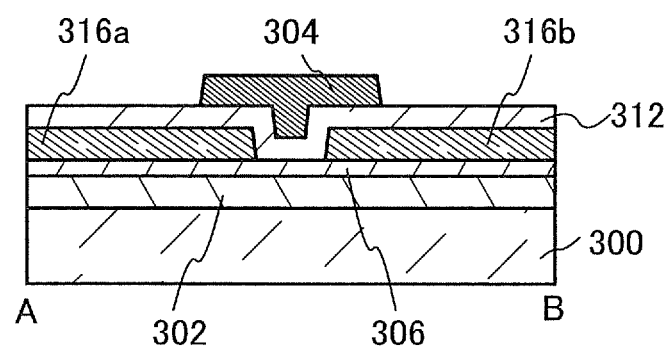

FIG. 9A is a top view of a transistor according to one embodiment of the present invention. FIG. 9B is a cross-sectional view along dashed-dotted line A-B in FIG. 9A. Note that for simplicity, a gate insulating film 312 and the like are not shown in FIG. 9A.

The transistor illustrated in FIG. 9B includes a base insulating film 302 over a substrate 300; an oxide semiconductor film 306 formed over the base insulating film 302; an electrode 316a and an electrode 316b formed over the oxide semiconductor film 306 and electrically isolated from each other; the gate insulating film 312 over the oxide semiconductor film 306, the electrode 316a, and the electrode 316b; and a gate electrode 304 provided over the gate insulating film 312 to overlap with a region between the electrode 316a and the electrode 316b.

For the oxide semiconductor film 306, an oxide film which is similar to that for the oxide semiconductor film 137 may be used.

For the base insulating film 302, an insulating film similar to that for the base insulating film 102 may be used.

As the substrate 300, a substrate similar to the substrate 100 may be used.

For the electrode 316a and the electrode 316b, a conductive film similar to that for the wiring 116a and the wiring 116b may be used.

For the gate insulating film 312, an insulating film similar to that for the gate insulating film 112 may be used.

For the gate electrode 304, a conductive film similar to that for the gate electrode 104 may be used.

Note that the gate electrode 304 partly overlaps with the electrode 316a and the electrode 316b.

A method for manufacturing the transistor illustrated in FIG. 9B will be described below.

Figure 10A:
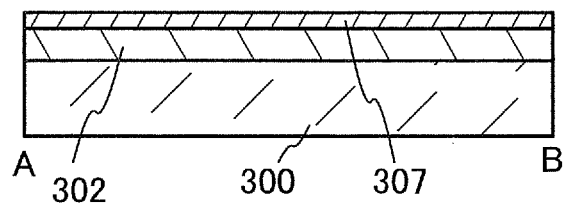
FIGS. 10A to 10C are cross-sectional views illustrating an example of a manufacturing method of a transistor according to one embodiment of the present invention.

First, the substrate 300 is prepared and the base insulating film 302 and the oxide semiconductor film 307 are formed in this order over the substrate 300 (see FIG. 10A).

Figure 10B:
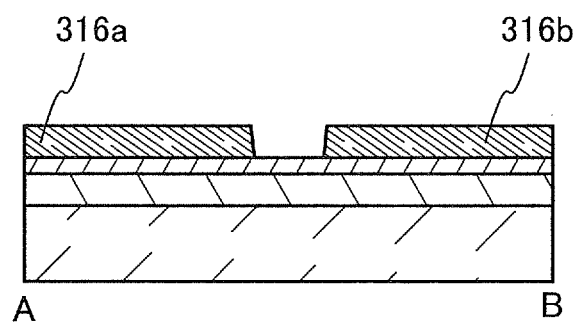

After that, a conductive film to be the electrode 316a and the electrode 316b is formed over the oxide semiconductor film 307 and processed, so that the electrode 316a and the electrode 316b are formed (see FIG. 10B).

Then, the gate insulating film 312 is formed over the oxide semiconductor film 307, the electrode 316a, and the electrode 316b.

Next, first heat treatment is performed. The first heat treatment may be performed in a manner similar to that of the first heat treatment described in Embodiment 1.

By the first heat treatment, hydrogen concentration in the oxide semiconductor film 307 is reduced. When heat treatment is performed at a temperature higher than or equal to 450° C. and lower than or equal to 700° C., oxygen vacancies in an oxide semiconductor film are normally increased; however, in this embodiment, oxygen is released from the base insulating film 302 or the like by the first heat treatment, whereby an increase in oxygen vacancies in the oxide semiconductor film 307 due to the first heat treatment can be suppressed by the released oxygen. Moreover, in some cases, the oxide semiconductor film 306 includes less oxygen vacancies than the oxide semiconductor film 307 just after being formed.

That is, by the first heat treatment, the oxide semiconductor film 306 can be an oxide semiconductor film which has low hydrogen concentration and does not show a signal at a g value of 1.93 by ESR. This means that the oxide semiconductor film 306 is an oxide semiconductor film which has extremely low hydrogen concentration, a small number of oxygen vacancies, and high resistance.

Note that it is preferable that not all the oxygen in the base insulating film 302 be released by the first heat treatment. Specifically, it is preferable that the base insulating film 302 show a signal at a g value of 2.01 by ESR even after the first heat treatment.

The first heat treatment is performed in a state where the oxide semiconductor film 307 is provided between the base insulating film 302 and the gate insulating film 312, whereby outward diffusion of oxygen released from the base insulating film 302 does not easily occur. In other words, the base insulating film 302 readily shows a signal at a g value of 2.01 by ESR even after the first heat treatment is performed.

Figure 10C:
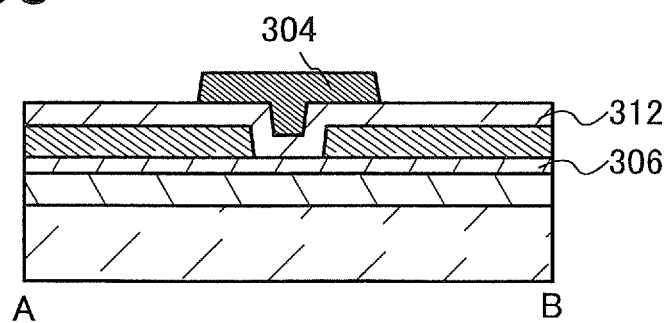

Then, a conductive film to be the gate electrode 304 is formed over the gate insulating film 312 and processed, so that the gate electrode 304 is formed (see FIG. 10C).

Note that the first heat treatment may be performed after the formation of the gate electrode 304, instead of after the formation of the gate insulating film 312.

Through the above-described process, the transistor illustrated in FIG. 9B can be manufactured.

In the above-described process, a photolithography process may be performed only in the formation of the electrode 316a, the electrode 316b, and the gate electrode 304. The number of photolithography processes can be reduced, so that the cost of manufacture of the transistor can be considerably reduced.

The transistor obtained in this embodiment uses the oxide semiconductor film having a small number of oxygen vacancies and low hydrogen concentration, and the base insulating film from which oxygen is released by heat treatment. Thus, change in electrical characteristics which results from operation of the transistor is small. In addition, a semiconductor device which uses the transistor is highly reliable.

This embodiment can be combined with the other embodiments as appropriate.

Embodiment 4

In this embodiment, transistors having structures different from those of the transistors in Embodiments 1 to 3 and a method for manufacturing the transistors will be described with reference to FIGS. 11A and 11B and FIGS. 12A to 12C.

Figure 11A:
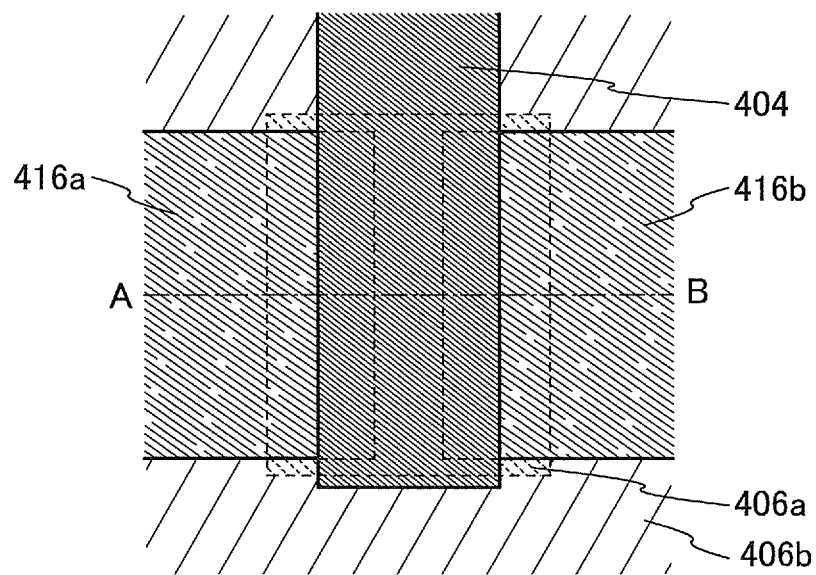
FIGS. 11A and 11B are a top view and a cross-sectional view illustrating an example of a transistor according to one embodiment of the present invention.
Figure 11B:
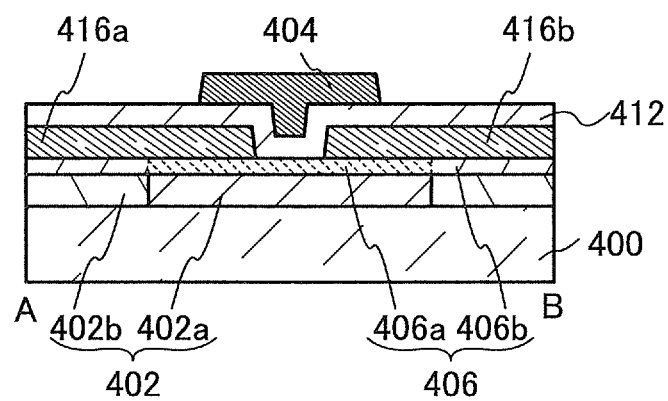

FIG. 11A is a top view of a transistor according to one embodiment of the present invention. FIG. 11B is a cross-sectional view along dashed-dotted line A-B in FIG. 11A. Note that for simplicity, a gate insulating film 412 and the like are not shown in FIG. 11A.

The transistor illustrated in FIG. 11B includes a base insulating film 402 which is formed over a substrate 400 and includes a first region 402a and a second region 402b; an oxide semiconductor film 406 which is formed over the base insulating film 402 and includes a third region 406a and a fourth region 406b; an electrode 416a and an electrode 416b which are formed over the oxide semiconductor film 406 and electrically isolated from each other; the gate insulating film 412 over the oxide semiconductor film 406, the electrode 416a, and the electrode 416b; and a gate electrode 404 which overlaps with the fourth region 406b of the oxide semiconductor film 406 with the gate insulating film 412 provided therebetween.

For the oxide semiconductor film 406, an oxide film which is similar to that for the oxide semiconductor film 207 may be used.

For the base insulating film 402 including the first region 402a and the second region 402b, an insulating film which is similar to that for the base insulating film 202 including the first region 202a and the second region 202b may be used.

Note that the transistor illustrated in FIG. 11B is similar to the transistor illustrated in FIG. 9B except for the structures of the base insulating film and the oxide semiconductor film.

As the substrate 400, a substrate similar to the substrate 100 may be used.

For the electrode 416a and the electrode 416b, a conductive film similar to that for the electrode 316a and the electrode 316b may be used.

For the gate insulating film 412, an insulating film similar to that for the gate insulating film 312 may be used.

For the gate electrode 404, a conductive film similar to that for the gate electrode 304 may be used.

Note that the gate electrode 404 partly overlaps with the electrode 416a and the electrode 416b.

A method for manufacturing the transistor illustrated in FIG. 11B will be described below.

First, the substrate 400 is prepared and the base insulating film 402 including the first region 402a and the second region 402b is formed over the substrate 400. The base insulating film 402 including the first region 402a and the second region 402b may be formed by a method similar to that of the base insulating film 202 described in Embodiment 2.

Figure 12A:
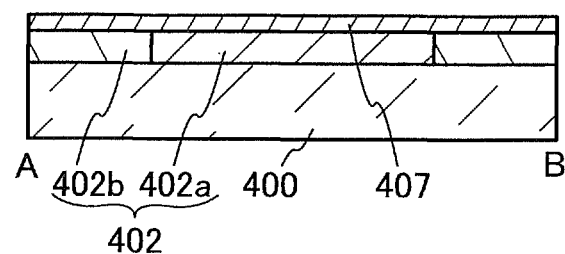
FIGS. 12A to 12C are cross-sectional views illustrating an example of a manufacturing method of a transistor according to one embodiment of the present invention.

Then, an oxide semiconductor film 407 is formed over the base insulating film 402 (see FIG. 12A).

Figure 12B:
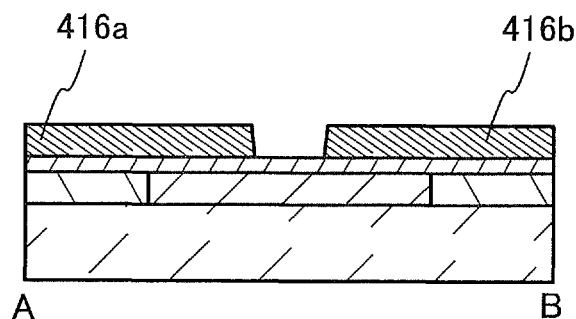

After that, a conductive film to be the electrode 416a and the electrode 416b is formed over the oxide semiconductor film 407 and processed, so that the electrode 416a and the electrode 416b are formed (see FIG. 12B).

Then, the gate insulating film 412 is formed over the oxide semiconductor film 407, the electrode 416a, and the electrode 416b.

Then, first heat treatment is performed, so that the oxide semiconductor film 406 including the third region 406a and the fourth region 406b is formed.

The first heat treatment may be performed in a manner similar to that of the first heat treatment described in Embodiment 1.

Here, the third region 406a of the oxide semiconductor film 406 is a region overlapping with the first region 402a of the base insulating film 402. The fourth region 406b of the oxide semiconductor film 406 is a region overlapping with the second region 402b of the base insulating film 402. The reason for this is that the first region 402a and the second region 402b of the base insulating film 402 differ in the amount of oxygen which is supplied from the base insulating film 402 to the oxide semiconductor film 407 by the first heat treatment.

Note that by the first heat treatment, the first region 402a of the base insulating film 402 releases almost all the oxygen which can be supplied to the oxide semiconductor film 406. Thus, the first region 402a of the base insulating film 402 does not show a signal at a g value of 2.01 by ESR after the first heat treatment. In contrast, the second region 402b of the base insulating film 402 shows a signal at a g value of 2.01 by ESR even after the first heat treatment.

The resistance of the third region 406a of the oxide semiconductor film 406 is unlikely to be increased as compared to that of the fourth region 406b of the oxide semiconductor film 406. Accordingly, an on-state current of the transistor which is formed in the third region 406a can be increased.

Figure 12C:
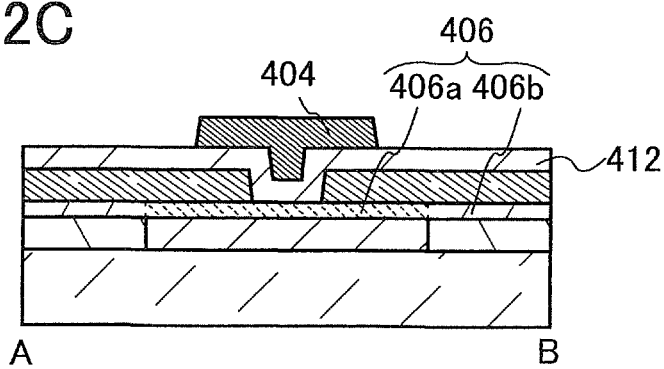

Then, a conductive film to be the gate electrode 404 is formed over the gate insulating film 412 and processed, so that the gate electrode 404 is formed (see FIG. 12C).

Note that the first heat treatment may be performed after the formation of the gate electrode 404, instead of after the formation of the gate insulating film 412.

Through the above-described process, the transistor illustrated in FIG. 11B can be manufactured.

In the above-described process, a photolithography process may be performed only in the formation of the base insulating film 402, the electrode 416a, the electrode 416b, and the gate electrode 404. The number of photolithography processes can be reduced, so that the cost of manufacture of the transistor can be considerably reduced.

The transistor obtained in this embodiment uses the oxide semiconductor film having a small number of oxygen vacancies and low hydrogen concentration, and the base insulating film from which oxygen is released by heat treatment. Thus, change in electrical characteristics which results from operation of the transistor is small. In addition, a semiconductor device which uses the transistor is highly reliable.

Further, the region of the oxide semiconductor film whose resistance is unlikely to be increased is provided in the transistor formation region, whereby the transistor can have a high on-state current.

This embodiment can be combined with the other embodiments as appropriate.

Embodiment 5

In this embodiment, a liquid crystal display device manufactured using the transistor described in any of Embodiments 1 to 4 will be described. Note that although an example in which one embodiment of the present invention is applied to the liquid crystal display device is described in this embodiment, the present invention is not limited thereto. For example, application of one embodiment of the present invention to an electroluminescence (EL) display device, which is one of light-emitting devices, is readily conceived by those skilled in the art.

Figure 18:
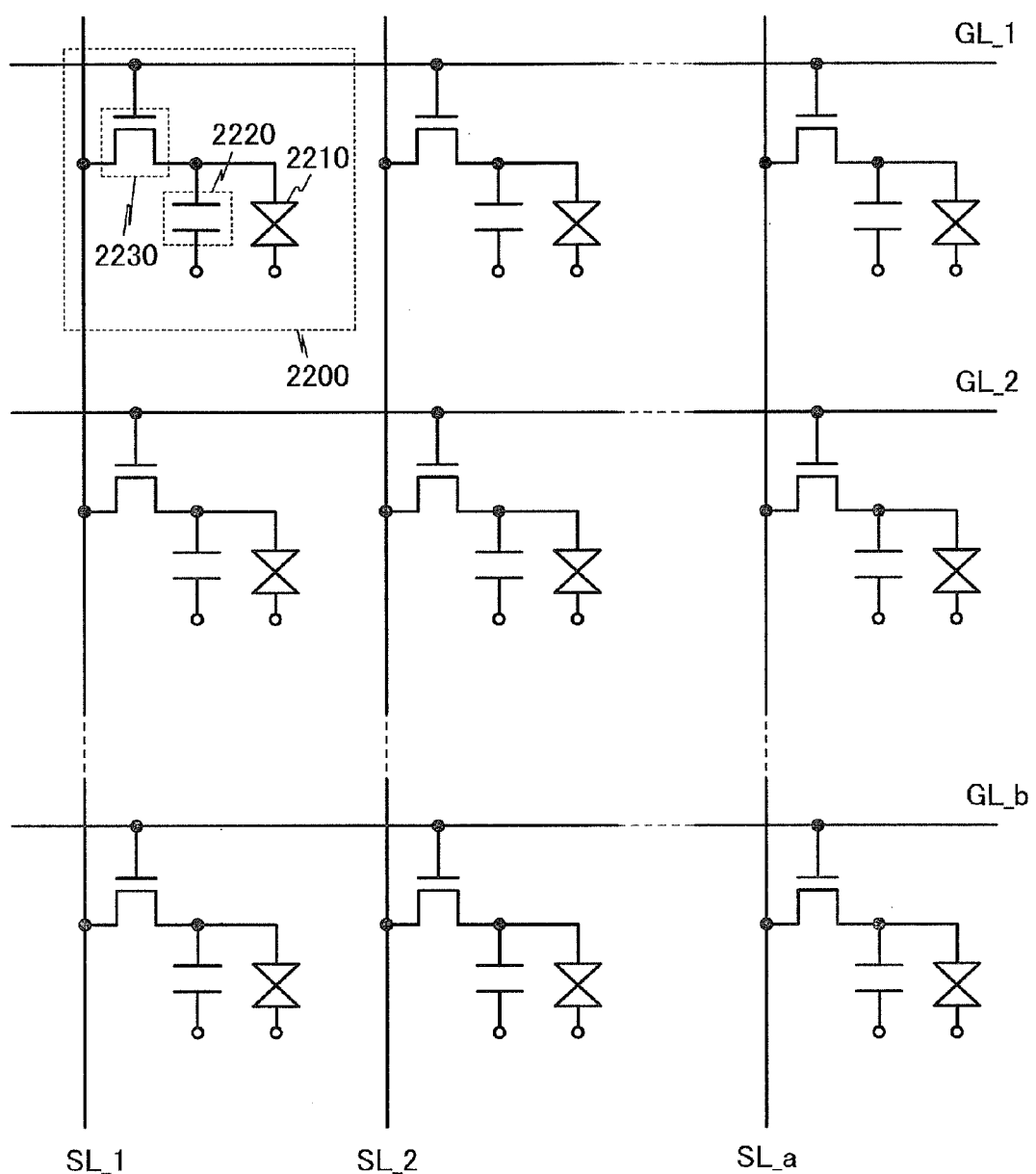
FIG. 18 is a circuit diagram illustrating an example of a liquid crystal display device according to one embodiment of the present invention.

FIG. 18 is a circuit diagram of an active matrix liquid crystal display device. The liquid crystal display device includes source lines SL_1 to SL_a, gate lines GL_1 to GL_b, and a plurality of pixels 2200. Each pixel 2200 includes a transistor 2230, a capacitor 2220, and a liquid crystal element 2210. A plurality of the pixels 2200 with such a structure forms a pixel portion of the liquid crystal display device. In the case where the source line or the gate line is simply mentioned, it may be denoted as the source line SL or the gate line GL.

The transistor described in any of Embodiments 1 to 4 is used as the transistor 2230. Since the transistor described in any of Embodiments 1 to 4 is a transistor including an oxide semiconductor with favorable electrical characteristics, a display device having high display quality can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other of the capacitor electrodes of the capacitor 2220 and the other of the pixel electrodes of the liquid crystal element 2210 are each connected to a common electrode. Note that the common electrode may be formed in the same layer as the gate line GL.

Further, the gate line GL is connected to a gate driver circuit. The gate driver circuit may include the transistor described in any of Embodiments 1 to 4.

The source line SL is connected to a source driver circuit. The source driver circuit may include the transistor described in any of Embodiments 1 to 4.

Note that either or both of the gate driver circuit and the source driver circuit may be formed over a separately prepared substrate and connected to the gate line GL and the source line SL, respectively, using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a voltage that is higher than or equal to the threshold voltage of the transistor 2230 is applied to the gate line GL, electric charge supplied from the source line SL flows as a drain current of the transistor 2230 and is accumulated in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out. A drain current is a current that flows between a drain and a source through a channel in a transistor. The drain current flows when a gate voltage is higher than the threshold voltage.

Note that since the transistor 2230 has a low off-state current, a period for holding the electric charge accumulated in the capacitors 2220 is long. Thus, the frequency of rewriting display can be reduced in the case of an image with little motion (including a still image), which enables a further reduction in power consumption. In addition, the capacitance of the capacitor 2220 can be further reduced, so that power consumption needed for charging can be reduced.

The liquid crystal display device can be highly reliable because in the transistor 2230, change in electrical characteristics which results from operation of the transistor is small.

In the above-described manner, according to one embodiment of the present invention, a highly reliable liquid crystal display device with high display quality and low power consumption can be provided.

This embodiment can be combined with the other embodiments as appropriate.

Embodiment 6

In this embodiment, an example of manufacturing a semiconductor memory device using the transistor described in any of Embodiments 1 to 4 will be described.

Typical examples of a volatile semiconductor memory device include a dynamic random access memory (DRAM) which stores data by selecting a transistor included in a memory element and accumulating an electric charge in a capacitor, and a static random access memory (SRAM) which holds stored data using a circuit such as a flip-flop.

Typical examples of a nonvolatile semiconductor memory device include a flash memory which has a floating gate between a gate and a channel region of a transistor and stores data by holding an electric charge in the floating gate.

The transistor described in any of Embodiments 1 to 4 can be applied to some of transistors included in the above-described semiconductor memory device.

Figure 19A:
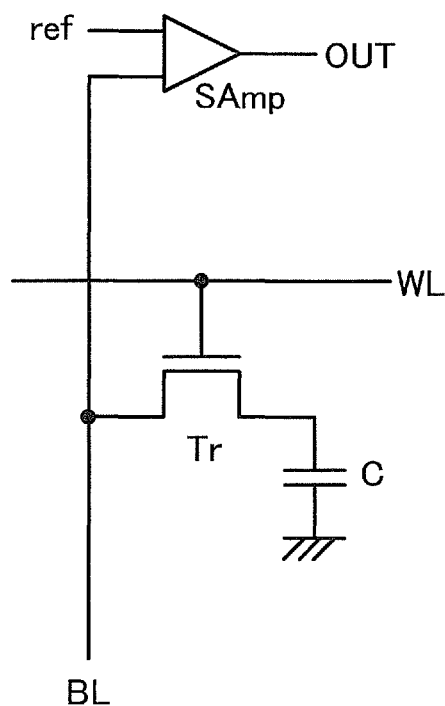
FIG. 19A is a circuit diagram illustrating an example of a semiconductor memory device according to one embodiment of the present invention.

First, a memory cell included in a semiconductor memory device to which the transistor described in any of Embodiments 1 to 4 is applied will be described with reference to FIGS. 19A and 19B.

The memory cell includes a transistor Tr and a capacitor C. One of a source and a drain of the transistor Tr is electrically connected to a bit line BL. The other of the source and the drain of the transistor Tr is electrically connected to the capacitor C. A gate of the transistor Tr is electrically connected to a word line WL. The bit line BL is electrically connected to a sense amplifier SAmp (see FIG. 19A).

Figure 19B:
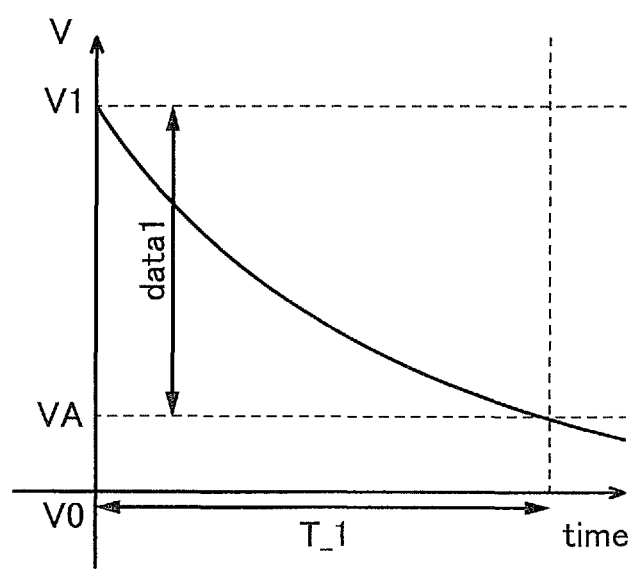
FIG. 19B shows electrical characteristics thereof.

Note that it is known that the voltage held in the capacitor C is gradually decreased with time as shown in FIG. 19B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when the transistor described in any of Embodiments 1 to 4 is used as the transistor Tr, the holding period T_1 can be increased because an off-state current of the transistor is low. That is, frequency of the refresh operation can be reduced; thus, power consumption can be reduced. For example, in the case where a transistor that includes an oxide semiconductor film and has an off-state current of $1\times10^{-21}$ A or lower, preferably $1\times10^{-24}$ A or lower is used in the memory cell, data can be held for several days to several decades without supply of electric power.

When the transistor described in any of Embodiments 1 to 4, whose change in electrical characteristics resulting from operation is small, is applied to the transistor Tr, the memory cell included in the semiconductor memory device can be highly reliable.

As described above, according to one embodiment of the present invention, a semiconductor memory device with high reliability and low power consumption can be provided.

Next, a memory cell included in a semiconductor memory device to which the transistor described in any of Embodiments 1 to 4 is applied and which has a structure different from that of the above-described semiconductor memory device will be described with reference to FIGS. 20A and 20B.

Figure 20A:
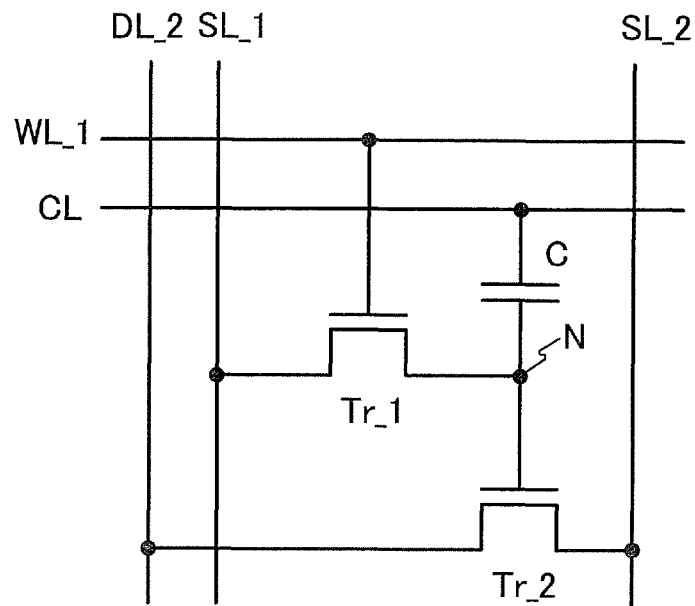
FIG. 20A is a circuit diagram illustrating an example of a semiconductor memory device according to one embodiment of the present invention.
Figure 20B:
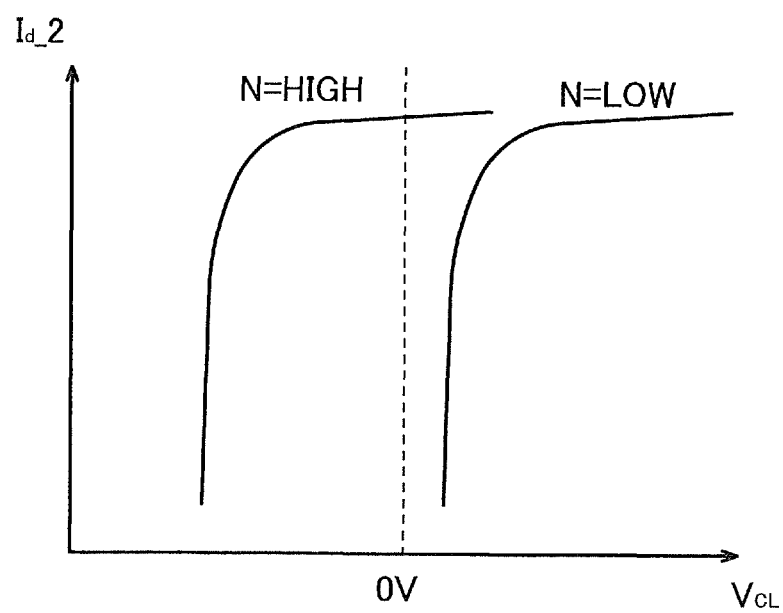
FIG. 20B shows electrical characteristics thereof.

FIG. 20A is a circuit diagram of a memory cell. The memory cell includes a transistor Tr_1, a transistor Tr_2, and a capacitor C. A gate of the transistor Tr_1 is electrically connected to a word line WL_1, and a source of the transistor Tr_1 is electrically connected to a source line SL_1. A source of the transistor Tr_2 is electrically connected to a source line SL_2, and a drain of the transistor Tr_2 is electrically connected to a drain line DL_2. One terminal of the capacitor C is electrically connected to a capacitor line CL. The other terminal of the capacitor C, a drain of the transistor Tr_1, and a gate of the transistor Tr_2 are electrically connected to a node N.

The memory cell can store data by utilizing variation in the apparent threshold voltage of the transistor Tr_2, which is caused corresponding to the potential of the node N. For example, FIG. 20B shows a relation between a voltage $V_{CL}$ of the capacitor line CL and a drain current $I_d\_2$ flowing through the transistor Tr_2.

Here, the voltage of the node N can be adjusted through the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_d\_2$ curve (N=LOW) or a $V_{CL}$-$I_d\_2$ curve (N=HIGH) can be obtained. That is, when N=LOW, $I_d\_2$ is small at a $V_{CL}$ of 0 V; accordingly, data 0 is stored. Further, when N=HIGH, $I_d\_2$ is large at a $V_{CL}$ of 0 V; accordingly, data 1 is stored. In such a manner, data can be stored.

Here, when the transistor described in any of Embodiments 1 to 4 is used as the transistor Tr_1, the off-state current of the transistor can be reduced; therefore, unintentional leakage of an electric charge accumulated in the node N by flowing between the source and the drain of the transistor Tr_1 can be suppressed. As a result, data can be held for a long time.

When the transistor described in any of Embodiments 1 to 4, whose change in electrical characteristics resulting from operation is small, is applied to the transistor Tr_1, the semiconductor memory device can be highly reliable.

Note that the transistor described in any of Embodiments 1 to 4 may be used as the transistor Tr_2.

As described above, according to one embodiment of the present invention, a semiconductor memory device with high reliability for a long time and low power consumption can be provided.

This embodiment can be combined with the other embodiments as appropriate.

Embodiment 7

A central processing unit (CPU) can be formed using the transistor described in any of Embodiments 1 to 4 or the semiconductor memory device described in Embodiment 6 for at least part of the CPU.

Figure 21A:
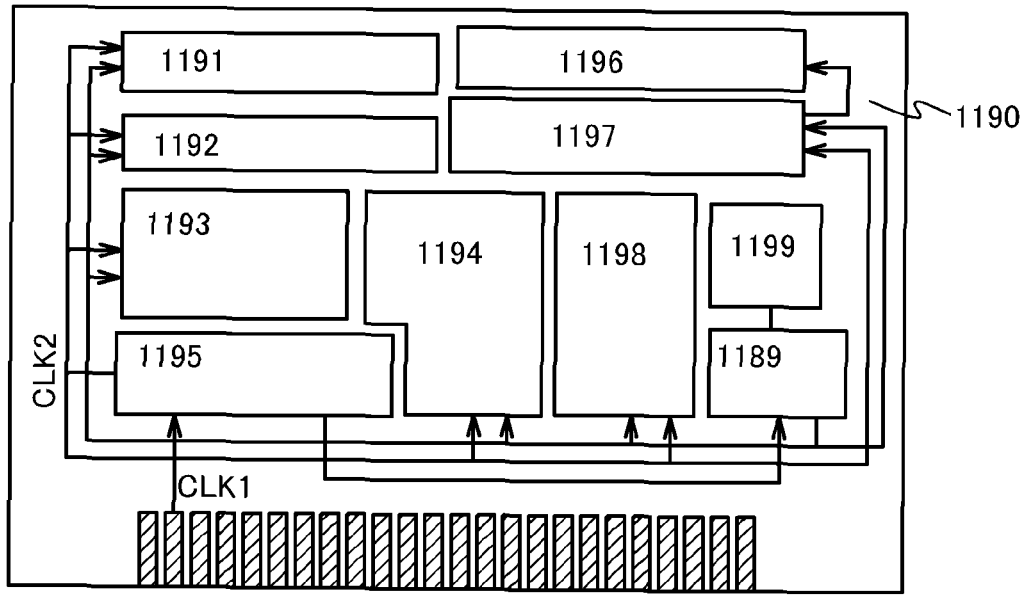
FIG. 21A is a block diagram illustrating a specific example of a CPU according to one embodiment of the present invention.

FIG. 21A is a block diagram illustrating a specific structure of the CPU. The CPU illustrated in FIG. 21A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 21A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 21A, a memory element is provided in the register 1196. As the memory element in the register 1196, for example, the semiconductor memory device described in Embodiment 6 can be used.

In the CPU illustrated in FIG. 21A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 21B:
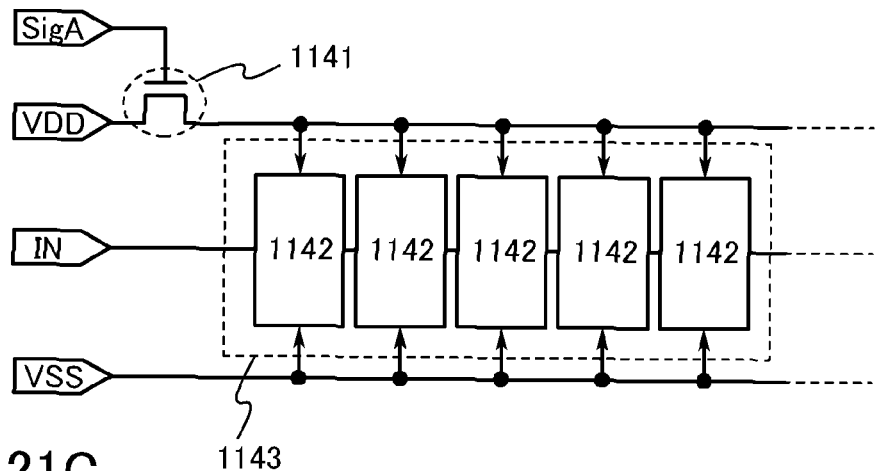
FIGS. 21B and 21C are circuit diagrams each illustrating a part of the CPU.
Figure 21C:
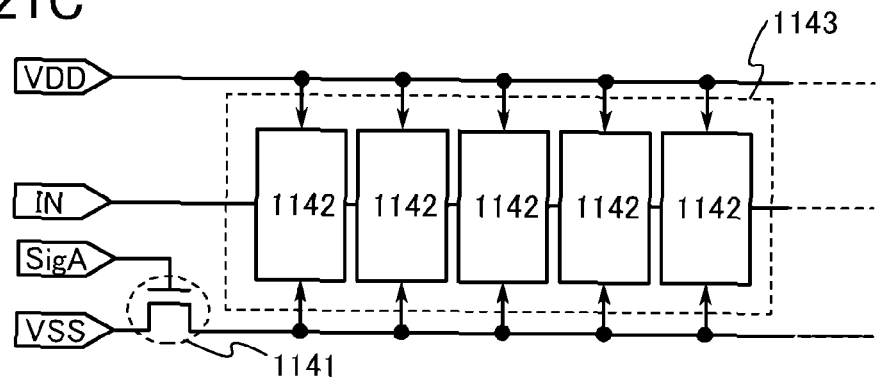

A switching element provided between a memory element group and a node to which a power supply potential VDD or a power supply potential VSS is supplied, as illustrated in FIG. 21B or FIG. 21C, allows the power supply voltage to be stopped. Circuits illustrated in FIGS. 21B and 21C will be described below.

FIGS. 21B and 21C each illustrate an example of a structure including the transistor described in any of Embodiments 1 to 4 as a switching element for controlling supply of a power supply voltage to a memory element.

The memory device illustrated in FIG. 21B includes a switching element 1141 and a memory element group 1143 including a plurality of memory elements 1142. Specifically, as each of the memory elements 1142, the memory element described in Embodiment 6 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 21B, the transistor described in any of Embodiments 1 to 4 is used as the switching element 1141, and the switching of the transistor is controlled by a signal Sig A supplied to a gate thereof.

Note that FIG. 21B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 21C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, one embodiment of the present invention can also be applied to an LSI such as a digital signal processor (DSP), a custom LSI, or a field programmable gate array (FPGA).

This embodiment can be implemented by being combined as appropriate with any of the above-described embodiments.

Embodiment 8

In this embodiment, examples of electronic devices to which any of Embodiments 1 to 7 is applied will be described.

Figure 22A:
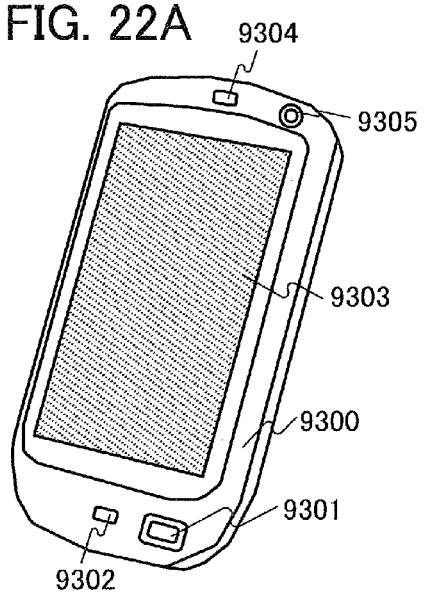
FIGS. 22A to 22D are perspective views each illustrating an example of an electronic device according to one embodiment of the present invention.

FIG. 22A illustrates a portable information terminal. The portable information terminal illustrated in FIG. 22A includes a housing 9300, a button 9301, a microphone 9302, a display portion 9303, a speaker 9304, and a camera 9305, and has a function as a mobile phone. Any of the other embodiments can be applied to the display portion 9303 and the camera 9305. Although not illustrated, any of the other embodiments can be applied to an arithmetic device, a wireless circuit, or a memory circuit in a main body.

Figure 22B:
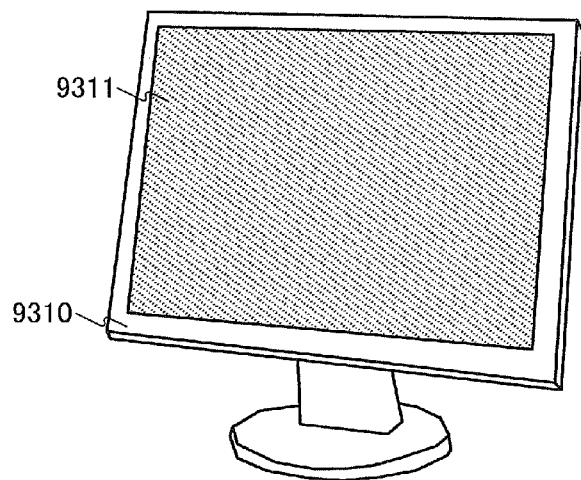

FIG. 22B illustrates a display. The display illustrated in FIG. 22B includes a housing 9310 and a display portion 9311. Any of the other embodiments can be applied to the display portion 9311, whereby a highly reliable display with high display quality can be provided even when the display portion 9311 has a large size.

Figure 22C:
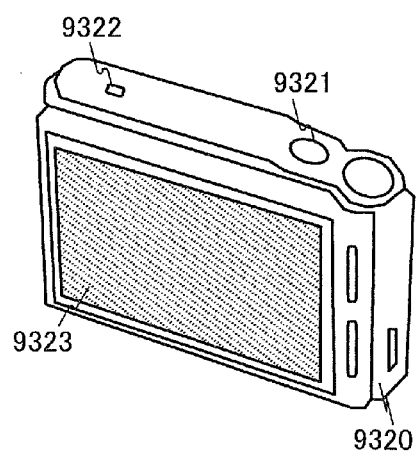

FIG. 22C illustrates a digital still camera. The digital still camera illustrated in FIG. 22C includes a housing 9320, a button 9321, a microphone 9322, and a display portion 9323. Any of the other embodiments can be applied to the display portion 9323. Although not illustrated, any of the other embodiments can also be applied to a memory circuit or an image sensor.

Figure 22D:
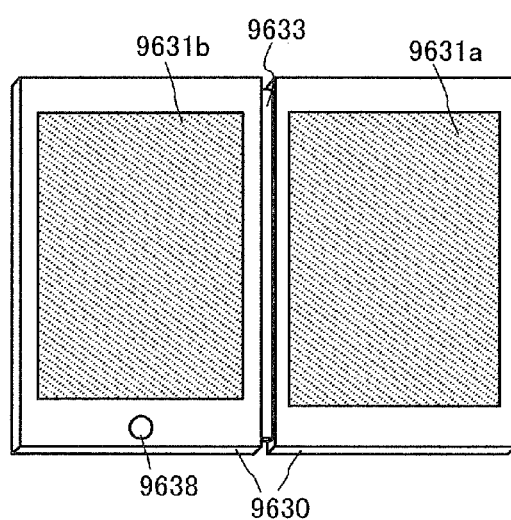

FIG. 22D illustrates a double-foldable portable information terminal. The double-foldable portable information terminal illustrated in FIG. 22D includes a housing 9630, a display portion 9631a, a display portion 9631b, a hinge 9633, and an operation switch 9638. Any of the other embodiments can be applied to the display portion 9631a and the display portion 9631b. Although not illustrated, any of the other embodiments can be applied to an arithmetic device, a wireless circuit, or a memory circuit in a main body.

Part or whole of the display portion 9631a and/or the display portion 9631b can function as a touch panel. By touching an operation key displayed on the touch panel, a user can input data, for example.

Thus, an electronic device according to one embodiment of the present invention is an electronic device with high performance and high reliability.

This embodiment can be combined with the other embodiments as appropriate.

Example 1

In this example, evaluation of the spin of samples each of which includes an oxide semiconductor film and a base insulating film was conducted by ESR.

For ESR, an electron spin resonance spectrometer JES-FA300 manufactured by JEOL Ltd. was used.

A method for forming the samples is described below.

First, a quartz substrate was prepared, and a base insulating film was formed over the quartz substrate. As the base insulating film, either an aluminum oxide film or a silicon oxide film was used.

The aluminum oxide film was formed by a sputtering method. Specifically, the aluminum oxide film was formed to a thickness of 300 nm under the following conditions: an aluminum oxide target was used, the atmosphere included argon with a flow rate of 25 sccm and oxygen with a flow rate of 25 sccm, the pressure was controlled to be 0.4 Pa, the substrate heating temperature at the time of the deposition was 250° C., and the deposition power was 2.5 kW (13.56 MHz).

The silicon oxide film was formed by a sputtering method. Specifically, the silicon oxide film was formed to a thickness of 300 nm under the following conditions: a silicon oxide target was used, the atmosphere included argon with a flow rate of 25 sccm and oxygen with a flow rate of 25 sccm, the pressure was controlled to be 0.4 Pa, the substrate heating temperature at the time of the deposition was 100° C., and the deposition power was 5 kW (13.56 MHz).

Then, an oxide semiconductor film was formed over the base insulating film.

The oxide semiconductor film was formed by a sputtering method. Specifically, the oxide semiconductor film was formed to a thickness of 100 nm under the following conditions: an In—Ga—Zn—O (In:Ga:Zn=1:1:1 [atomic ratio]) target was used, the atmosphere included oxygen with a flow rate of 45 sccm, the pressure was controlled to be 0.4 Pa, the substrate heating temperature at the time of the deposition was 400° C., and the deposition power was 500 W (DC).

After that, first heat treatment was performed at 450° C. in a nitrogen gas atmosphere for one hour.

Then, a protective insulating film was formed over the oxide semiconductor film.

The protective insulating film was formed by a plasma CVD method. Specifically, the protective insulating film was formed to a thickness of 100 nm under the following conditions: the atmosphere included monosilane with a flow rate of 1 sccm and nitrous oxide with a flow rate of 800 sccm, the pressure was controlled to be 40 Pa, the substrate heating temperature at the time of the deposition was 400° C., and a power of 150 W (60 MHz) was applied to the electrode.

After that, the substrate was divided into samples of 3 mm×20 mm.

Then, the divided substrate was subjected to second heat treatment in a nitrogen gas atmosphere for one hour. The second heat treatment was performed at 250° C., 300° C., 350° C., 400° C., 450° C., 500° C., 550° C., or 600° C.

The ESR evaluation was conducted on two stacked samples. Note that the ESR evaluation was conducted at room temperature and a microwave power of 20 mW (9.2 GHz). The samples were placed such that the direction of a magnetic field was parallel to the surface of the substrate.

Figure 13A:
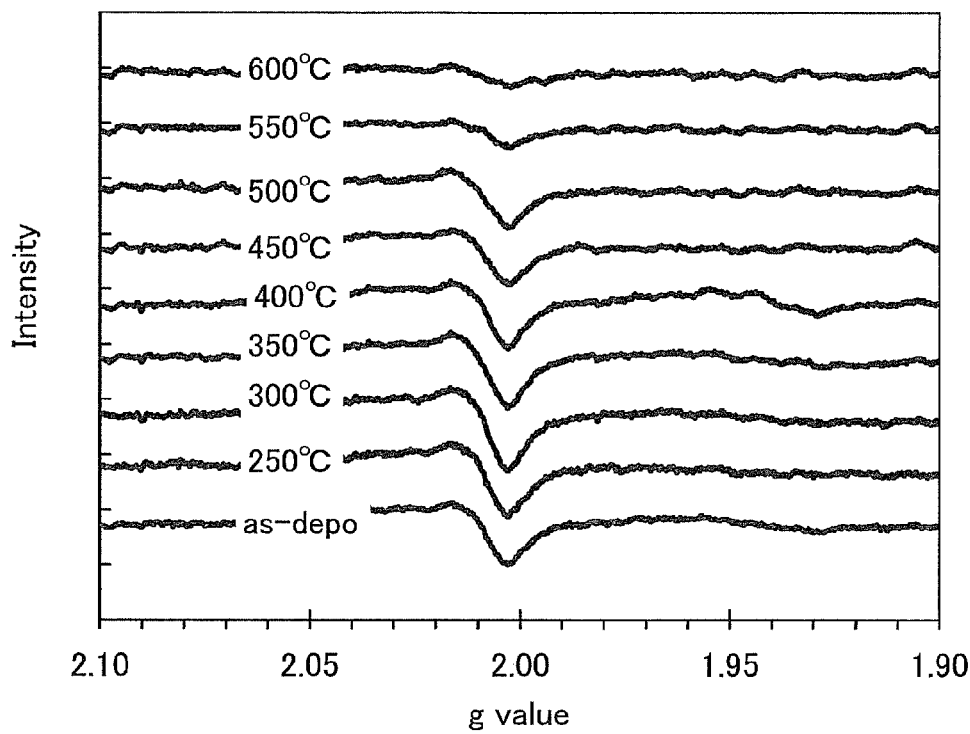
FIGS. 13A and 13B show ESR spectra.
Figure 13B:
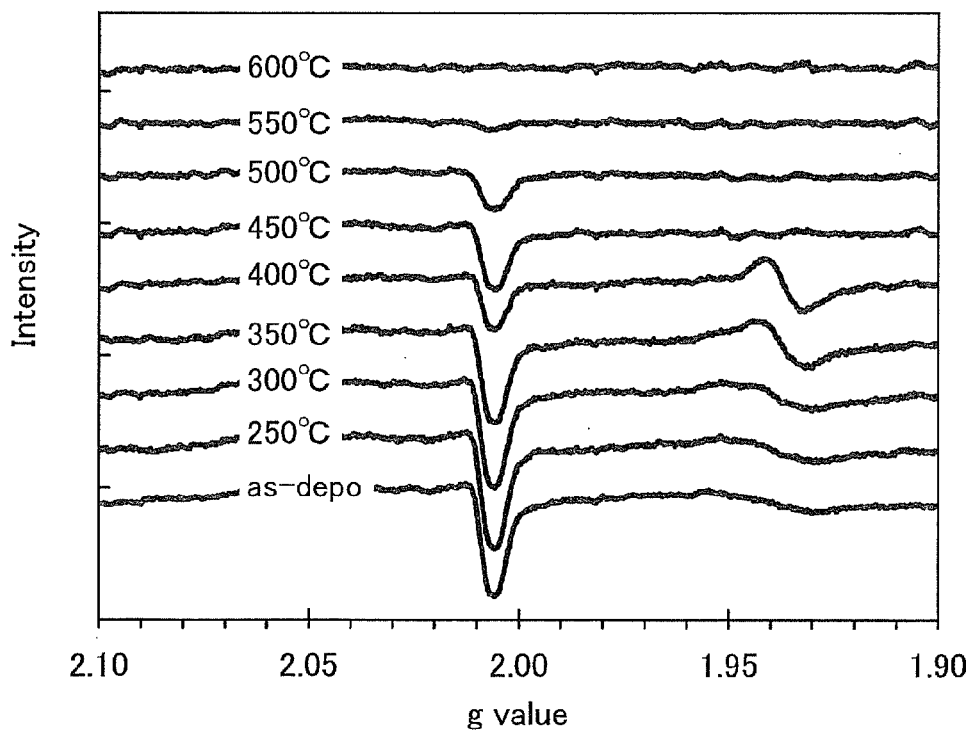

The results are shown in FIGS. 13A and 13B. Here, FIG. 13A shows ESR spectra of the samples using the aluminum oxide film as the base insulating film. FIG. 13B shows ESR spectra of the samples using the silicon oxide film as the base insulating film. Note that the temperature given for each ESR spectrum in FIGS. 13A and 13B denotes the temperature of the second heat treatment. The description "as-depo" given for the ESR spectra in FIGS. 13A and 13B means that the sample was not subjected to the second heat treatment.

In FIGS. 13A and 13B, attention is focused on the signal shown at a g value of 2.01. As shown in FIG. 13A, in the samples using the aluminum oxide film as the base insulating film, the higher the temperature of the second heat treatment was, the lower the spin density of spins corresponding to the signal was. In addition, the sample on which the second heat treatment was performed at 600° C. also showed the signal. As shown in FIG. 13B, also in the samples using the silicon oxide film as the base insulating film, the higher the temperature of the second heat treatment was, the lower the spin density of spins corresponding to the signal was. Yet, as for the samples on which the second heat treatment was performed at 550° C. and 600° C., the signal disappeared or was extremely small. Note that quantified values of the spin densities of the spins corresponding to the signal shown at a g value of 2.01 are shown in Table 1 below.

TABLE 1

| Heat treatment temperature [° C.] | Spin density [spins/cm³] | |
|---|---|---|
| | Aluminum oxide film | Silicon oxide film |
| as-depo | 2.1E+18 | 4.3E+18 |
| 250 | 1.9E+18 | 6.6E+18 |
| 300 | 2.7E+18 | 5.0E+18 |
| 350 | 2.0E+18 | 4.4E+18 |
| 400 | 2.2E+18 | 7.6E+17 |
| 450 | 2.0E+18 | 8.0E+17 |
| 500 | 1.8E+18 | 7.9E+17 |
| 550 | 1.1E+18 | unmeasurable |
| 600 | 1.1E+18 | unmeasurable |

Table 1 shows that in the samples using the aluminum oxide film as the base insulating film, the spin density of spins corresponding to the signal shown at a g value of 2.01 is $1 \times 10^{18}$ spins/cm³ or more even after the heat treatment at 600° C. or lower is performed.

In a similar manner, attention is focused on the signal shown at a g value of 1.93 in FIGS. 13A and 13B. As shown in FIG. 13A, the signal was observed in the cases of the sample of "as-depo" and the sample on which the second heat treatment was performed at 400° C. among the samples using the aluminum oxide film as the base insulating film. The signal was not observed in the cases of the other samples. As shown in FIG. 13B, the signal was also observed in the cases of the sample of "as-depo" and the samples on which the second heat treatment was performed at 250° C. to 400° C. among the samples using the silicon oxide film as the base insulating film. The signal was not observed in the cases of the other samples.

As already shown, in the ESR spectra of the samples which used the aluminum oxide film as the base insulating film, the sample on which the heat treatment was performed at any of the temperatures from 250° C. to 600° C. in the state where the oxide semiconductor film was provided between the base insulating film and the protective insulating film showed the signal at a g value of 2.01. Further, the samples other than the sample of "as-depo" and the sample subjected to the heat treatment at 400° C. did not show the signal at a g value of 1.93.

In the ESR spectra of the samples which used the silicon oxide film as the base insulating film, the sample on which the heat treatment was performed at any of the temperatures from 250° C. to 500° C. in the state where the oxide semiconductor film was provided between the base insulating film and the protective insulating film showed the signal at a g value of 2.01. However, in the case where the temperature of the heat treatment was 550° C. or 600° C., the signal at a g value of 2.01 was not shown. Further, the samples other than the sample of "as-depo" and the samples subjected to the heat treatment at 250° C. to 400° C. did not show the signal at a g value of 1.93.

This example shows that, in the case where the base insulating film is an aluminum oxide film, the oxide semiconductor film over the base insulating film does not show the signal at a g value of 1.93 by ESR after heat treatment at any of the temperatures from 450° C. to 600° C. is performed, and that the base insulating film shows the signal at a g value of 2.01 even after the heat treatment at any of the temperatures from 450° C. to 600° C.

It is also shown that, in the case where the base insulating film is a silicon oxide film, the oxide semiconductor film over the base insulating film does not show the signal at a g value of 1.93 by ESR after heat treatment at 450° C. or 500° C. is performed, and that the base insulating film shows the signal at a g value of 2.01 even after the heat treatment at 450° C. or 500° C. Further, it is shown that the oxide semiconductor film does not show the signal at a g value of 1.93 by ESR after heat treatment at 550° C. or 600° C. is performed, and that the base insulating film does not show the signal at a g value of 2.01 after the heat treatment at 550° C. or 600° C.

Example 2

In this example, a released gas from a sample which includes an insulating film was evaluated by TDS.

For the evaluation of the released gas, a thermal desorption spectroscopy apparatus manufactured by ESCO Ltd., EMD-WA1000S/W was used.

A method for forming the samples is described below.

First, a silicon wafer was prepared and a thermal oxidation film was formed on the silicon wafer. The thermal oxidation film was formed to a thickness of 100 nm at 950° C. in an oxygen atmosphere containing HCl at 3%.

Then, either an aluminum oxide film or a silicon oxide film was formed as an insulating film over the thermal oxidation film.

The aluminum oxide film was formed by a sputtering method. Specifically, the aluminum oxide film was formed to a thickness of 100 nm under the following conditions: an aluminum oxide target was used, the atmosphere included argon with a flow rate of 25 sccm and oxygen with a flow rate of 25 sccm, the pressure was controlled to be 0.4 Pa, the substrate heating temperature at the time of the deposition was 250° C., and the deposition power was 2.5 kW (13.56 MHz).

The silicon oxide film was formed by a sputtering method. Specifically, the silicon oxide film was formed to a thickness of 300 nm under the following conditions: a silicon oxide target was used, the atmosphere included oxygen with a flow rate of 50 sccm, the pressure was controlled to be 0.4 Pa, the substrate heating temperature at the time of the deposition was 100° C., and the deposition power was 2 kW (13.56 MHz).

Then, the amounts of the released gases from the samples were evaluated.

Figure 14A:
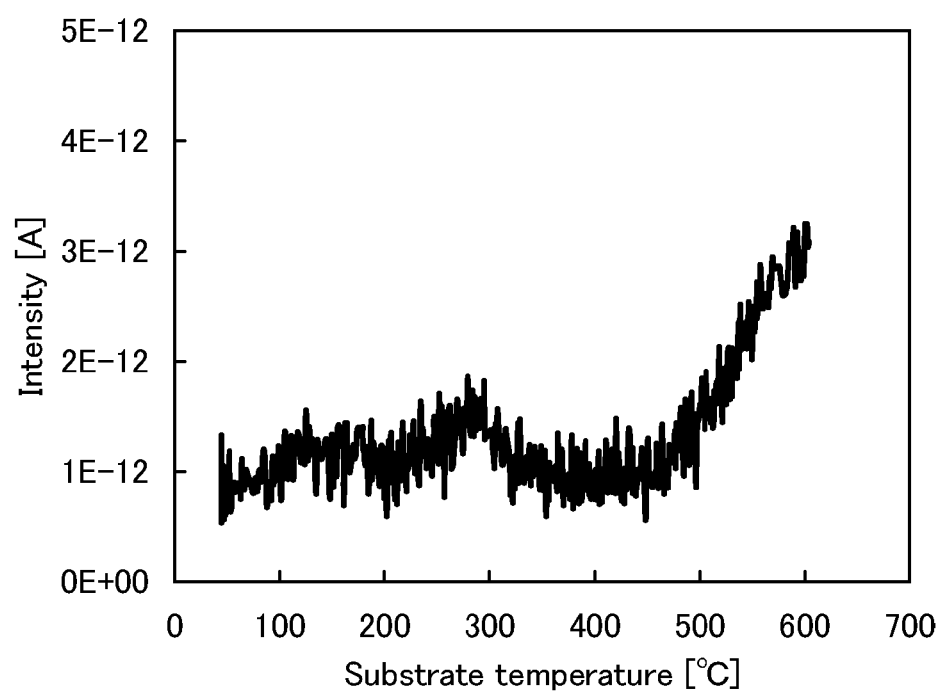
FIGS. 14A and 14B show ion intensities of a gas at m/z=32 which are obtained by TDS.
Figure 14B:
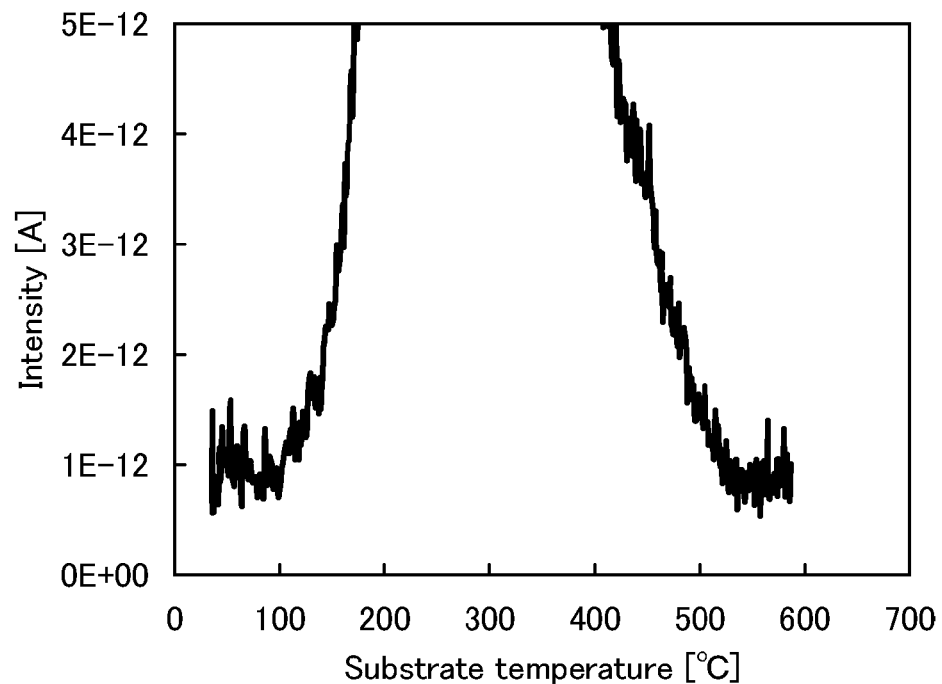

FIGS. 14A and 14B show ion intensities of a gas at m/z=32 which were obtained by TDS. Here, FIG. 14A shows the ion intensity, obtained by TDS, of the released gas from the sample using the aluminum oxide film as the insulating film. FIG. 14B shows the ion intensity, obtained by TDS, of the released gas from the sample using the silicon oxide film as the insulating film.

The ion intensity of the released gas from the sample using the aluminum oxide film as the insulating film in FIG. 14A, which was obtained by TDS, reveals that the gas at m/z=32 was released when the substrate temperatures were 450° C. or higher. Although a gas released at substrate temperatures of 600° C. or higher could not be evaluated due to measurement limitations, the temperature at which the amount of the released gas at m/z=32 reaches a maximum can be estimated to be higher than 600° C.

The ion intensity of the released gas from the sample using the silicon oxide film as the insulating film in FIG. 14B, which was obtained by TDS, reveals that the gas at m/z=32 was released when the substrate temperatures were higher than or equal to 100° C. and lower than or equal to 500° C. Note that when converted into the number of oxygen atoms, the released amount was $5.0 \times 10^{20}$ atoms/cm³. Although a gas released at substrate temperatures of 600° C. or higher could not be evaluated due to measurement limitations, it is found that at least the gas at m/z=32 is hardly released when the substrate temperature is in a range of higher than or equal to 500° C. and lower than or equal to 600° C.

This example shows that the temperature at which oxygen is released is higher in an aluminum oxide film than in a silicon oxide film. Accordingly, it is found that even after heat treatment is performed at 450° C. or higher, the aluminum oxide film contains a sufficient amount of oxygen which can be released.

It is also found that in a silicon oxide film, most of oxygen which can be released is lost by heat treatment at 450° C. or higher.

Figure 15A:
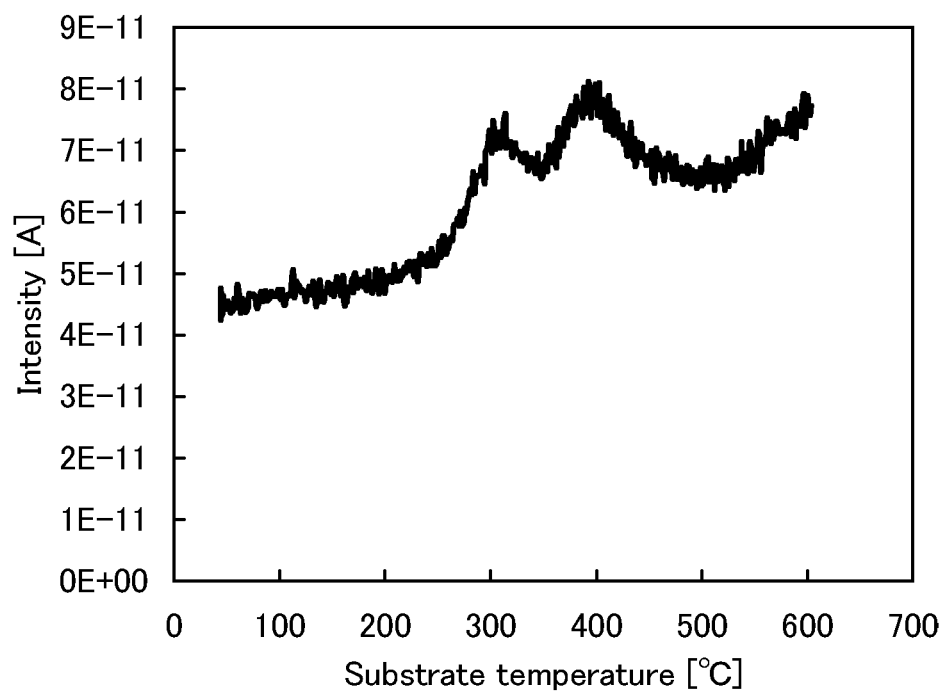
FIGS. 15A and 15B show ion intensities of a gas at m/z=2 which are obtained by TDS.
Figure 15B:
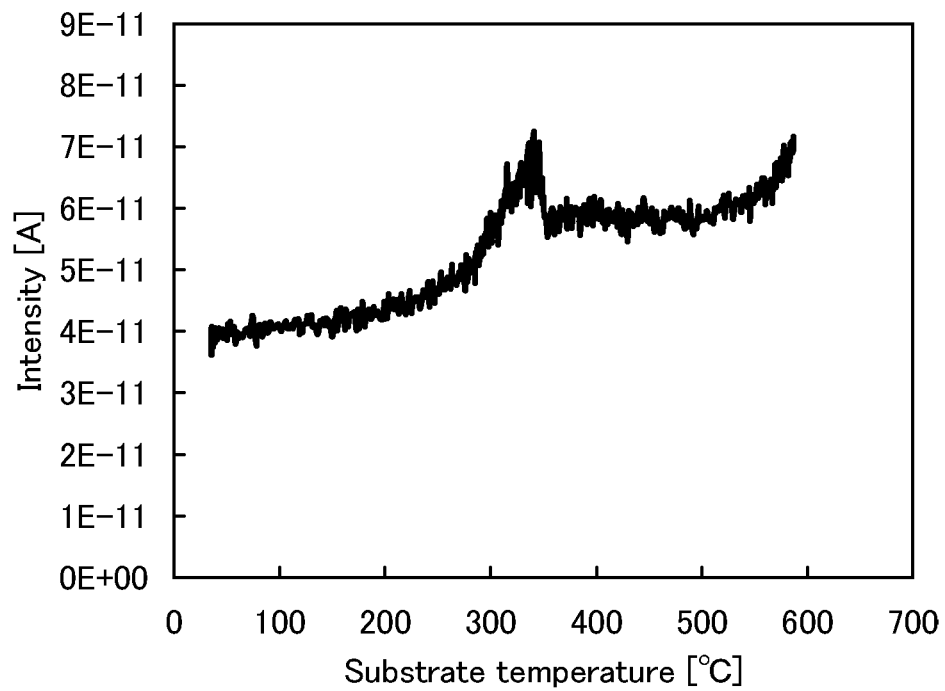

Next, FIGS. 15A and 15B show ion intensities of a gas at m/z=2 which were obtained by TDS. Here, FIG. 15A shows the ion intensity, obtained by TDS, of the released gas from the sample using the aluminum oxide film as the insulating film. FIG. 15B shows the ion intensity, obtained by TDS, of the released gas from the sample using the silicon oxide film as the insulating film.

The ion intensity of the released gas from the sample using the aluminum oxide film as the insulating film in FIG. 15A, which was obtained by TDS, reveals that the amount of the released gas at m/z=2 had the local maximum values when the substrate temperatures were 320° C. and 410° C. Although a gas released at substrate temperatures of 600° C. or higher could not be evaluated due to measurement limitations, it can be estimated that the higher the substrate temperature is, the larger the amount of the released gas at m/z=2 is.

The ion intensity of the released gas from the sample using the silicon oxide film as the insulating film in FIG. 15B, which was obtained by TDS, reveals that the amount of the released gas at m/z=2 had the maximum value when the substrate temperature was 350° C. Although a gas released at substrate temperatures of 600° C. or higher could not be evaluated due to measurement limitations, it can be estimated that the higher the substrate temperature is, the larger the amount of the released gas at m/z=2 is.

This example shows that the temperature at which oxygen is released is higher in an aluminum oxide film than in a silicon oxide film. Accordingly, it is found that even after heat treatment is performed at 450° C. or higher, the aluminum oxide film contains a sufficient amount of oxygen which can be released.

It is also found that in a silicon oxide film, most of oxygen which can be released is lost by heat treatment at 450° C. or higher.

This example indicates that hydrogen can be effectively released from the base insulating film by performing heat treatment at a temperature higher than the temperature at which the amount of released hydrogen from the base insulating film had the local maximum value. For example, the temperature of the heat treatment can be 350° C. or higher, preferably 450° C. or higher, further preferably 500° C. or higher.

Example 3

In this example, the resistivity, carrier density, and Hall mobility of the oxide semiconductor film provided between the base insulating film and the protective insulating film were measured by the Hall effect measurement.

ResiTest8300 series manufactured by TOYO Corporation was used for the Hall effect measurement.

A method for forming the samples is described below.

First, a glass substrate was prepared, and a base insulating film was formed over the glass substrate. As the base insulating film, either an aluminum oxide film or a silicon oxide film was used.

The aluminum oxide film was formed by a sputtering method. Specifically, the aluminum oxide film was formed to a thickness of 100 nm under the following conditions: an aluminum oxide target was used, the atmosphere included argon with a flow rate of 25 sccm and oxygen with a flow rate of 25 sccm, the pressure was controlled to be 0.4 Pa, the substrate heating temperature at the time of the deposition was 250° C., and the deposition power was 2.5 kW (13.56 MHz).

The silicon oxide film was formed by a sputtering method. Specifically, the silicon oxide film was formed to a thickness of 300 nm under the following conditions: a silicon oxide target was used, the atmosphere included argon with a flow rate of 25 sccm and oxygen with a flow rate of 25 sccm, the pressure was controlled to be 0.4 Pa, the substrate heating temperature at the time of the deposition was 100° C., and the deposition power was 5 kW (13.56 MHz).

Then, an oxide semiconductor film was formed over the base insulating film.

The oxide semiconductor film was formed by a sputtering method. Specifically, the oxide semiconductor film was formed to a thickness of 30 nm under the following conditions: an In—Ga—Zn—O (In:Ga:Zn=1:1:1 [atomic ratio]) target was used, the atmosphere included oxygen with a flow rate of 45 sccm, the pressure was controlled to be 0.4 Pa, the substrate heating temperature at the time of the deposition was 400° C., and the deposition power was 500 W (DC).

After that, first heat treatment was performed at 450° C. in a nitrogen gas atmosphere for one hour.

Then, four circular electrodes (Ti) each having a diameter of 1 mm were formed as four terminals for the Hall effect measurement. The electrodes were arranged in a square, and the interval between the centers of the electrodes was 8 mm.

Then, a protective insulating film was formed over the electrodes and the oxide semiconductor film.

The protective insulating film was formed by a plasma CVD method. Specifically, the protective insulating film was formed to a thickness of 100 nm under the following conditions: the atmosphere included monosilane with a flow rate of 1 sccm and nitrous oxide with a flow rate of 800 sccm, the pressure was controlled to be 40 Pa, the substrate heating temperature at the time of the deposition was 400° C., and a power of 150 W (60 MHz) was applied to the electrode.

Then, the protective insulating film was processed, so that opening portions exposing only the electrodes were formed.

The substrates were divided into pieces of 10 mm×10 mm such that the four electrodes were included in each of the pieces.

Then, the divided substrate was subjected to second heat treatment in a nitrogen gas atmosphere for one hour. The second heat treatment was performed at 250° C., 300° C., 350° C., 400° C., 450° C., 500° C., 550° C., or 600° C.

After that, the resistivity, carrier density, and Hall mobility of the samples were evaluated.

FIGS. 16A to 16C and FIGS. 17A to 17C show the results.

Figure 16A:
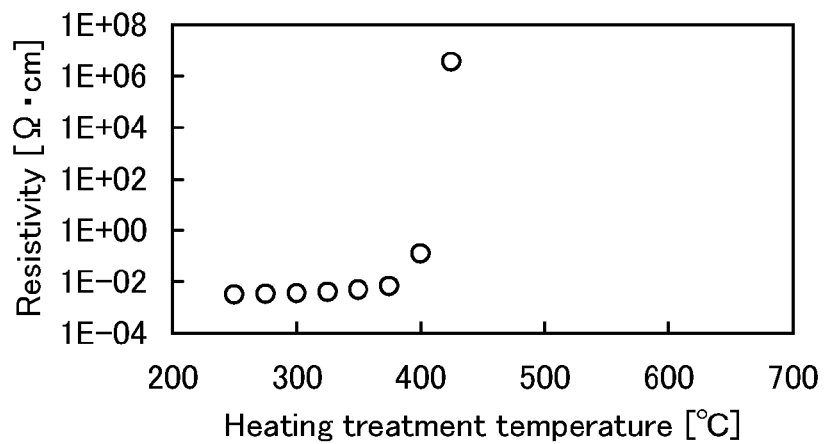
FIGS. 16A to 16C show Hall effect measurement results of a sample.
Figure 16B:
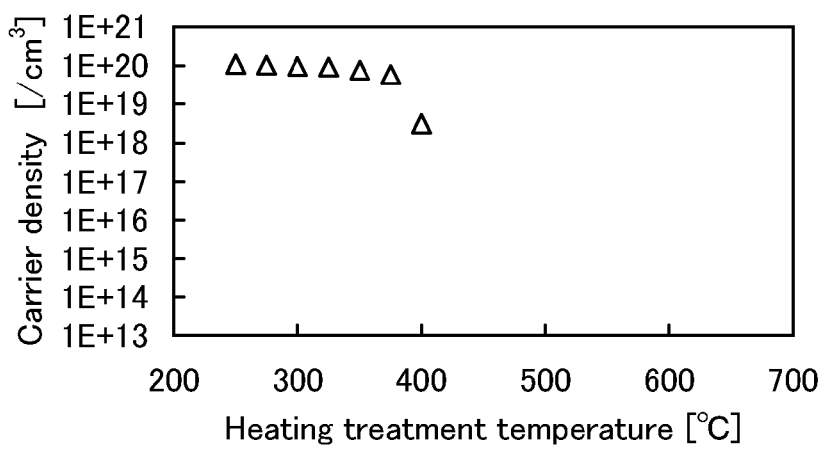
Figure 16C:
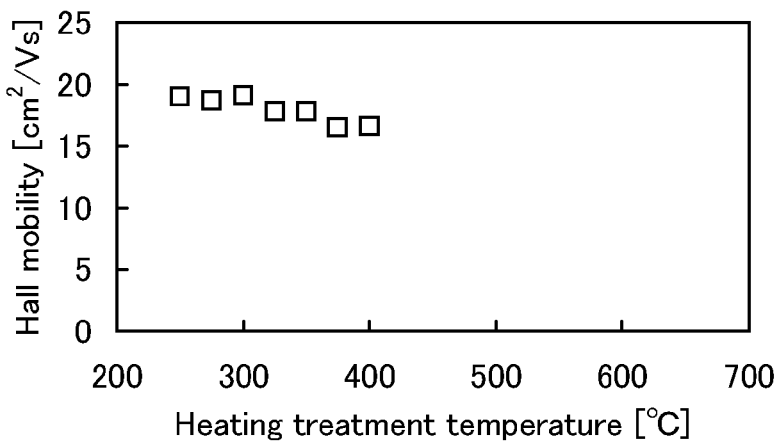

FIGS. 16A to 16C show the results of the Hall effect measurement of the samples using the aluminum oxide film as the base insulating film. Note that FIG. 16A shows a relation between the temperature of the second heat treatment and the resistivity, FIG. 16B shows a relation between the temperature of the second heat treatment and the carrier density, and FIG. 16C shows a relation between the temperature of the second heat treatment and the Hall mobility.

FIG. 16A reveals that the resistivity sharply increased when the temperature of the second heat treatment exceeded 400° C. It was also found that when the second heat treatment was performed at 450° C. or higher, the resistivity was 3 kΩ·cm or more, which exceeded the measurement limit of the Hall effect measurement.

FIGS. 16B and 16C reveal that an increase in temperature of the second heat treatment did not lead to a big change in the Hall mobility but led to a significant reduction in carrier density.

Since a carrier generation source for the oxide semiconductor film is hydrogen and oxygen vacancies, it can be said that the hydrogen and/or oxygen vacancies in the oxide semiconductor film were successively reduced by performing the second heat treatment at 400° C. or higher.

Figure 17A:
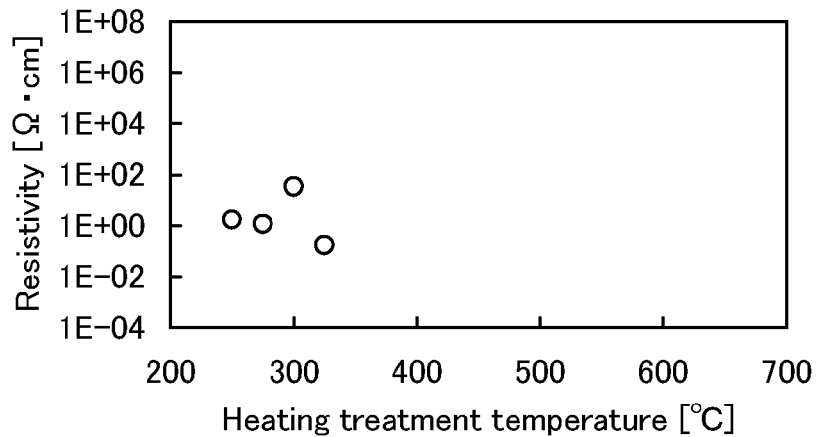
FIGS. 17A to 17C show Hall effect measurement results of a sample.
Figure 17B:
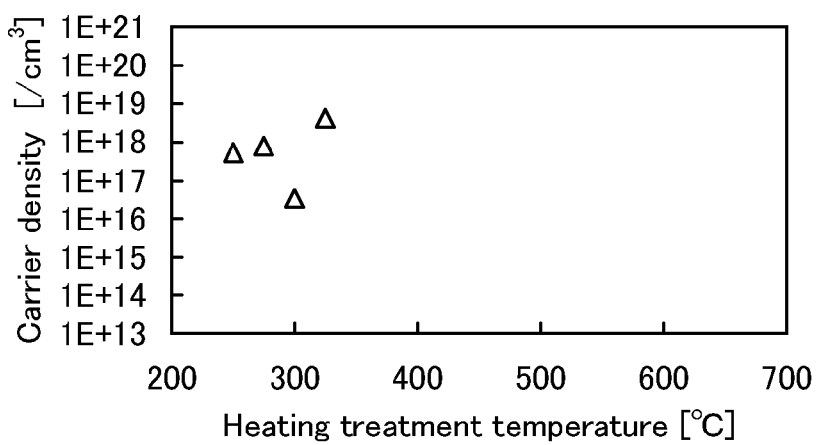
Figure 17C:
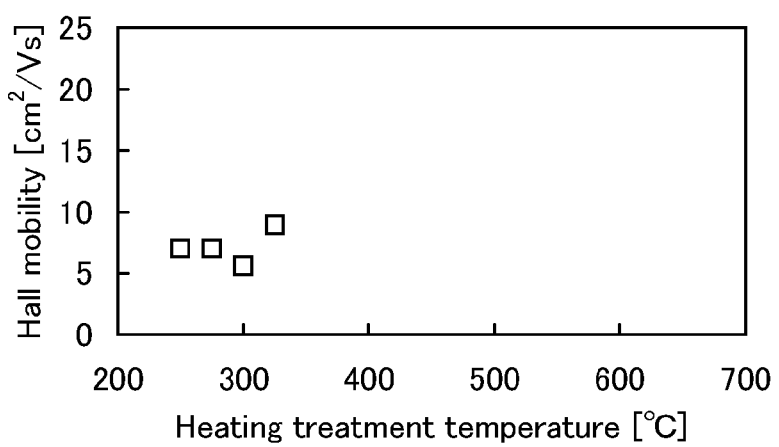

Next, FIGS. 17A to 17C show the results of the Hall effect measurement of the samples using the silicon oxide film as the base insulating film. Note that FIG. 17A shows a relation between the temperature of the second heat treatment and the resistivity, FIG. 17B shows a relation between the temperature of the second heat treatment and the carrier density, and FIG. 17C shows a relation between the temperature of the second heat treatment and the Hall mobility.

FIG. 17A reveals that when the second heat treatment was performed at 350° C. or higher, the resistivity was 3 kΩ·cm or more, which exceeded the measurement limit of the Hall effect measurement.

Since a carrier generation source for the oxide semiconductor film is hydrogen and oxygen vacancies, it can be said that the hydrogen and/or oxygen vacancies in the oxide semiconductor film were successively reduced by performing the second heat treatment at 350° C. or higher.

According to Example 2, the temperature at which oxygen is released is lower in a silicon oxide film than in an aluminum oxide film. It is clear from the results of Example 3 that release of oxygen from the base insulating film correlates with an increase in resistivity (a reduction in carrier density) of the oxide semiconductor film.

It is also clear from Examples 1 and 2 that the sample whose base insulating film can release oxygen shows a signal at a g value of 2.01 by ESR.

Thus, in order to reduce the carrier density of an oxide semiconductor film, oxygen vacancies in the oxide semiconductor film are preferably reduced by using an insulating film showing a signal at a g value of 2.01 by ESR as a base insulating film. In addition, it can be understood that it is important to form a base insulating film which, even after heat treatment at 450° C. or higher, contains oxygen that can be released by heat treatment because hydrogen in the base insulating film is the other carrier generation source for the oxide semiconductor film and heat treatment at 450° C. or higher is effective in reducing the concentration of the hydrogen.

This application is based on Japanese Patent Application serial no. 2011-231477 filed with Japan Patent Office on Oct. 21, 2011, the entire contents of which are hereby incorporated by reference.

What is claimed is:

1. A semiconductor device comprising:
   an insulating film;
   an oxide semiconductor film over the insulating film, the oxide semiconductor film comprising indium;
   a gate insulating film over the oxide semiconductor film; and
   a gate electrode over the gate insulating film, wherein the gate electrode overlaps with the oxide semiconductor film,
   wherein the oxide semiconductor film has a spin density of less than $5\times10^{16}$ spins/cm$^3$ at a g value greater than or equal to 1.88 and less than or equal to 1.98 by electron spin resonance.

2. The semiconductor device according to claim 1, further comprising:
   an interlayer insulating film over the gate electrode; and
   a wiring over the interlayer insulating film, wherein the wiring is in contact with the oxide semiconductor film through an opening provided in the interlayer insulating film and the gate insulating film.

3. The semiconductor device according to claim 1, wherein the insulating film comprises an oxide of a material selected from the group consisting of magnesium, aluminum, vanadium, chromium, germanium, yttrium, lanthanum, hafnium, zirconium, and tantalum.

4. The semiconductor device according to claim 1, wherein the insulating film is formed by a sputtering method.

5. The semiconductor device according to claim 1, wherein the oxide semiconductor film includes an impurity region formed by introducing an impurity by using the gate electrode as a mask.

6. The semiconductor device according to claim 1, wherein the oxide semiconductor film comprises at least one of indium, zinc and gallium.

7. A semiconductor device comprising:
   an insulating film;
   an oxide semiconductor film over the insulating film, the oxide semiconductor film comprising indium;
   a gate insulating film over the oxide semiconductor film; and
   a gate electrode over the gate insulating film, wherein the gate electrode overlaps with the oxide semiconductor film,
   wherein the insulating film has a spin density of $5\times10^{17}$ spins/cm$^3$ or more at a g value greater than or equal to 2.005 and less than or equal to 2.015 by electron spin resonance, and
   wherein the oxide semiconductor film has a spin density of less than $5\times10^{16}$ spins/cm$^3$ at a g value greater than or equal to 1.88 and less than or equal to 1.98 by electron spin resonance.

8. The semiconductor device according to claim 7, further comprising:
   an interlayer insulating film over the gate electrode; and
   a wiring over the interlayer insulating film, wherein the wiring is in contact with the oxide semiconductor film through an opening provided in the interlayer insulating film and the gate insulating film.

9. The semiconductor device according to claim 7, wherein the insulating film comprises an oxide of a material selected from the group consisting of magnesium, aluminum, vanadium, chromium, germanium, yttrium, lanthanum, hafnium, zirconium, and tantalum.

10. The semiconductor device according to claim 7, wherein the insulating film is formed by a sputtering method.

11. The semiconductor device according to claim 7, wherein the oxide semiconductor film includes an impurity region formed by introducing an impurity by using the gate electrode as a mask.

12. A semiconductor device comprising:
an insulating film comprising a first region and a second region;
an oxide semiconductor film over the insulating film, the oxide semiconductor film comprising indium, wherein the oxide semiconductor film comprises a third region and a fourth region;
a gate insulating film over the oxide semiconductor film; and
a gate electrode over the gate insulating film, wherein the gate electrode overlaps with the fourth region of the oxide semiconductor film,
wherein the third region of the oxide semiconductor film overlaps with the first region of the insulating film,
wherein the fourth region of the oxide semiconductor film overlaps with the second region of the insulating film,
wherein the second region of the insulating film has a spin density of $5\times10^{17}$ spins/cm$^3$ or more at a g value greater than or equal to 2.005 and less than or equal to 2.015 by electron spin resonance, and
wherein the third region of the oxide semiconductor film has a spin density of less than $5\times10^{16}$ spins/cm$^3$ at a g value greater than or equal to 1.88 and less than or equal to 1.98 by electron spin resonance.

13. The semiconductor device according to claim 12, wherein the first region of the insulating film has a spin density of less than $5\times10^{17}$ spins/cm$^3$ at a g value greater than or equal to 2.005 and less than or equal to 2.015 by electron spin resonance.

14. The semiconductor device according to claim 12, further comprising:
an interlayer insulating film over the gate electrode; and
a wiring over the interlayer insulating film, wherein the wiring is in contact with the oxide semiconductor film through an opening provided in the interlayer insulating film and the gate insulating film.

15. The semiconductor device according to claim 12, wherein the second region of the insulating film comprises an oxide of a material selected from the group consisting of magnesium, aluminum, vanadium, chromium, germanium, yttrium, lanthanum, hafnium, zirconium, and tantalum.

16. The semiconductor device according to claim 12, wherein the first region of the insulating film comprises silicon oxide.

17. The semiconductor device according to claim 12, wherein the insulating film is formed by a sputtering method.

18. The semiconductor device according to claim 12, wherein the oxide semiconductor film includes an impurity region formed by introducing an impurity by using the gate electrode as a mask.

* * * * *